US008232550B2

(12) United States Patent
Clough et al.

(10) Patent No.: US 8,232,550 B2
(45) Date of Patent: Jul. 31, 2012

(54) MIXED SOLVENT SYSTEMS FOR DEPOSITION OF ORGANIC SEMICONDUCTORS

(75) Inventors: Robert S. Clough, St. Paul, MN (US); David H. Redinger, Oakdale, MN (US); James C. Novack, Hudson, WI (US)

(73) Assignee: 3M Innovative Properties Company, Saint Paul, MN (US)

(*) Notice: Subject to any disclaimer, the term of this patent is extended or adjusted under 35 U.S.C. 154(b) by 0 days.

(21) Appl. No.: 12/996,473

(22) PCT Filed: May 29, 2009

(86) PCT No.: PCT/US2009/045571
§ 371 (c)(1),
(2), (4) Date: Dec. 6, 2010

(87) PCT Pub. No.: WO2009/151978
PCT Pub. Date: Dec. 17, 2009

(65) Prior Publication Data
US 2011/0092015 A1 Apr. 21, 2011

Related U.S. Application Data

(60) Provisional application No. 61/060,595, filed on Jun. 11, 2008.

(51) Int. Cl.
*H01L 29/08* (2006.01)
(52) U.S. Cl. ............ 257/40; 257/E51.027; 438/99; 252/500
(58) Field of Classification Search .......... 438/99; 257/40, E51.027; 252/500
See application file for complete search history.

(56) References Cited

U.S. PATENT DOCUMENTS

| | | | |
|---|---|---|---|
| 6,265,243 B1 | 7/2001 | Katz | |
| 6,551,717 B2 | 4/2003 | Katz | |
| 6,690,029 B1 | 2/2004 | Anthony | |
| 6,864,396 B2 | 3/2005 | Smith | |
| 7,061,010 B2 | 6/2006 | Minakata | |
| 7,211,679 B2 | 5/2007 | Gerlach | |
| 7,241,437 B2 | 7/2007 | Davidson | |

(Continued)

FOREIGN PATENT DOCUMENTS

DE 102004007777 9/2005

(Continued)

OTHER PUBLICATIONS

Kim, "High-Mobility Organic Transistors Based on Single-Crystalline Microribbons of Triisopropylsilylethynyl Pentacene via Solution-Phase Self Assembly", Advanced Materials, Mar. 2007, vol. 19, Issue 5, pp. 678-682.

(Continued)

*Primary Examiner* — Khiem D Nguyen
(74) *Attorney, Agent, or Firm* — Jean A. Lown

(57) ABSTRACT

Compositions that contain an organic semiconductor dissolved in a solvent mixture are described. More specifically, the solvent mixture includes an alkane having 9 to 16 carbon atoms in an amount equal to 1 to 20 weight percent and an aromatic compound in an amount equal to 80 to 99 weight percent. The semiconductor material is dissolved in the solvent mixture in an amount equal to at least 0.1 weight percent based on a total weight of the composition. Methods of making a semiconductor device using the compositions to form a semiconductor layer are also described.

22 Claims, 1 Drawing Sheet

U.S. PATENT DOCUMENTS

| | | |
|---|---|---|
| 7,264,872 B2 | 9/2007 | Walker, Jr. |
| 7,319,153 B2 | 1/2008 | Vogel |
| 7,576,208 B2 | 8/2009 | Brown |
| 7,704,785 B2 | 4/2010 | Steiger |
| 7,820,077 B2 | 10/2010 | Spreitzer |
| 7,879,688 B2 | 2/2011 | Novack |
| 7,948,016 B1 | 5/2011 | Schnobrich |
| 2004/0222412 A1 | 11/2004 | Bai |
| 2006/0220007 A1* | 10/2006 | Bailey et al. .................. 257/40 |
| 2007/0137520 A1 | 6/2007 | Brown |
| 2007/0146426 A1 | 6/2007 | Nelson |
| 2007/0158643 A1 | 7/2007 | Vogel |
| 2007/0173578 A1 | 7/2007 | Spreitzer |
| 2007/0232781 A1 | 10/2007 | Zhu |
| 2007/0249087 A1* | 10/2007 | Zhu et al. .................. 438/99 |
| 2007/0249802 A1 | 10/2007 | Zhu |
| 2008/0265214 A1 | 10/2008 | Steiger |
| 2009/0001356 A1 | 1/2009 | Novack |
| 2011/0073813 A1 | 3/2011 | Caldwell |
| 2011/0079775 A1 | 4/2011 | Zhu |

FOREIGN PATENT DOCUMENTS

| | | |
|---|---|---|
| EP | 1850405 | 10/2007 |
| WO | WO 2005/055248 | 6/2005 |
| WO | WO 2005/112145 | 11/2005 |
| WO | WO 2008/066933 | 6/2008 |
| WO | WO 2009/155106 | 12/2009 |
| WO | WO 2009/158201 | 12/2009 |
| WO | WO 2010/138807 | 12/2010 |

OTHER PUBLICATIONS

Lee, "Solution-processable pentacene microcrystal arrays for high performance organic field-effect transistors", Applied Physic Letters, Mar. 26, 2007, vol. 90, Issue 13, pp. 132106-1-132106-3.

Lim, "Self-Organization of Ink-jet-Printed Triisopropylsilylethynyl Pentacene via Evaporation-Induced Flows in a Drying Droplet", Advanced Functional Materials, Jan. 2008, vol. 18, Issue 2, pp. 229-234.

International Search Report for PCT/US2009/045571, 4 pgs, (Aug. 24, 2009).

* cited by examiner

MIXED SOLVENT SYSTEMS FOR DEPOSITION OF ORGANIC SEMICONDUCTORS

CROSS REFERENCE TO RELATED APPLICATIONS

This application is a national stage filing under 35 U.S.C. 371 of PCT/US2009/045571, filed May 29, 2009, which claims priority to Provisional Application No 61/060,595, filed Jun. 11, 2008, the disclosure of which is incorporated by reference in its/their entirety herein.

BACKGROUND

Traditionally, inorganic materials have dominated the semiconductor industry. For example, silicon and gallium arsenide have been used as semiconductor materials, silicon dioxide has been used as an insulator material, and metals such as aluminum and copper have been used as electrode materials. In recent years, however, there has been an increasing research effort aimed at using organic materials rather than the traditional inorganic materials in semiconductor devices. Among other benefits, the use of organic materials may enable lower cost manufacturing of electronic devices, may enable large area applications, and may enable the use of flexible substrates as supports for electronic circuitry in display backplanes, integrated circuits RFID tags, and sensors.

A variety of organic semiconductor materials have been considered, the most common being fused aromatic ring compounds as exemplified by acenes. At least some of these organic semiconductor materials have performance characteristics such as charge-carrier mobility, on/off current ratios, and sub-threshold voltages that are comparable or superior to those of amorphous silicon-based devices. Typically, these materials have been vapor deposited since they are not very soluble in most organic solvents. When organic semiconductors have been deposited from solution (such as a solution of the organic semiconductor dissolved in an organic solvent), good or optimum performance characteristics have been difficult to achieve.

SUMMARY

There is a need for compositions that contain an organic semiconductor material dissolved in organic solvents for use in the preparation of semiconductor devices such as, for example, thin film transistors. There is a need for such compositions to provide semiconductor devices having performance characteristics (such as high saturation field effect mobility ($\mu$)) that have not typically been achieved using known compositions and preparation methods.

In a first aspect, a composition is provided that includes (a) a solvent mixture and (b) an organic semiconductor material dissolved in the solvent mixture. The solvent mixture contains (i) an alkane having 6 to 16 carbon atoms present in an amount in a range of 1 to 20 weight percent based on a weight of the solvent mixture and (ii) an aromatic compound of Formula (I) present in an amount in a range of 80 to 99 weight percent based on the weight of the solvent mixture.

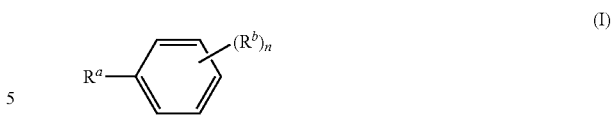

In Formula (I), the group $R^a$ is an alkyl, a heteroalkyl, an alkoxy, a heteroalkoxy, or a fused 5 or 6 member ring. Each group $R^b$ is independently selected from an alkyl, an alkoxy, or a halo. The variable n is an integer in the range of 0 to 5. The amount of the organic semiconductor material dissolved in the solvent mixture is equal to at least 0.1 weight percent based on a total weight of the composition.

In a second aspect, a composition is provided that includes (a) a solvent mixture and (b) an organic semiconductor dissolved in the solvent mixture. The solvent mixture contains (i) an alkane having 6 to 16 carbon atoms present in an amount in a range of 1 to 20 weight percent based on a weight of the solvent mixture and (ii) an aromatic compound of Formula (I) present in an amount in a range of 80 to 99 weight percent based on the weight of the solvent mixture.

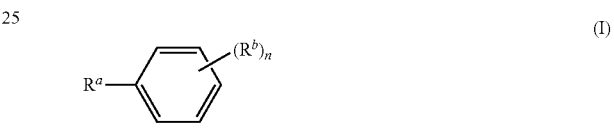

In Formula (I), the group $R^a$ is an alkyl, a heteroalkyl, an alkoxy, a heteroalkoxy, or a fused 5 or 6 member ring. Each group $R^b$ is independently selected from an alkyl, an alkoxy, or a halo. The variable n is an integer in the range of 0 to 5. The semiconductor material is of Formula (II).

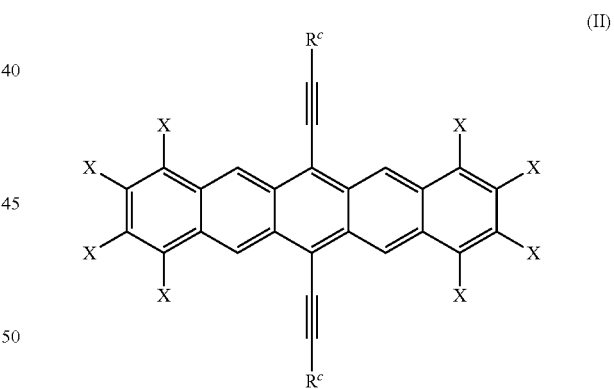

In Formula (II), each $R^c$ is independently selected from an unsubstituted or substituted alkyl, an unsubstituted or substituted heteroalkyl, an unsubstituted or substituted alkenyl, an unsubstituted or substituted aryl, an unsubstituted or substituted heteroaryl, a ferrocenyl, or a silyl group of formula —Si($R^d$)$_3$. Each $R^d$ is independently selected from hydrogen, an unsubstituted or substituted alkyl, an unsubstituted or substituted heteroalkyl, an unsubstituted or substituted alkenyl, an unsubstituted or substituted alkynyl, a substituted or unsubstituted aryl, an unsubstituted or substituted heteroaryl, or acetyl. Suitable substituents for an alkyl or heteroalkyl include an aryl, heteroaryl, halo, cyano, hydroxyl, or carboxyl group (i.e., —COOH). Suitable substituents for alkenyl or alkynyl include an alkoxy, aryl, heteroaryl, halo, cyano, hydroxyl, or carboxyl group. Suitable substituents for an aryl or heteroaryl include an alkyl, alkoxy, heteroalkyl, halo, cyano, hydroxyl, —ScH, or carboxyl group. Each X is independently selected from hydrogen, halo, alkyl, alkoxy, aryl, heteroaryl, alkenyl, cyano, or heteroalkyl. The amount of the organic semiconductor material dissolved in the solvent mixture is equal to at least 0.1 weight percent based on a total weight of the composition.

In a third aspect, a method of making a semiconductor device is provided. The method includes providing a composition that contains (a) a solvent mixture and (b) an organic semiconductor material dissolved in the solvent mixture. The solvent mixture contains (i) an alkane having 6 to 16 carbon atoms present in an amount in a range of 1 to 20 weight percent based on a weight of the solvent mixture and (ii) an aromatic compound of Formula (I) present in an amount in a range of 80 to 99 weight percent based on the weight of the solvent mixture.

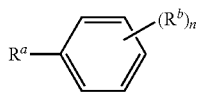
(I)

In Formula (I), the group $R^a$ is an alkyl, a heteroalkyl, an alkoxy, a heteroalkoxy, or a fused 5 to 6 member ring. Each group $R^b$ is independently selected from an alkyl, an alkoxy, or a halo. The variable n is an integer in the range of 0 to 5. The amount of the organic semiconductor material dissolved in the solvent mixture is equal to at least 0.1 weight percent based on a total weight of the composition. The method further includes depositing the composition adjacent to a conductive material or adjacent to a dielectric material to form a deposited layer and then removing at least 80 weight percent of the solvent mixture from the deposited layer to form a semiconductor layer.

BRIEF DESCRIPTION OF THE DRAWINGS

The invention may be more completely understood in consideration of the following detailed description of various embodiments of the invention in connection with the accompanying drawings, in which.

Figure 1:
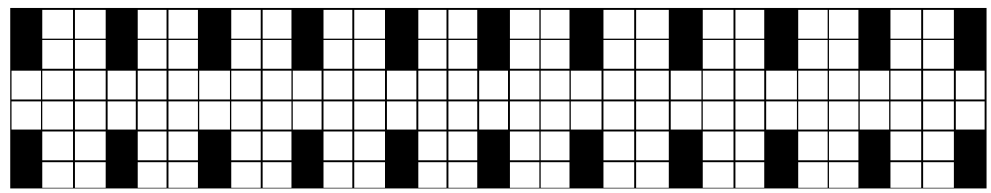
FIG. 1 is an exemplary print pattern for using the semiconductor composition.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

In several places throughout the application, guidance is provided through lists of examples, which examples can be used in various combinations. In each instance, the recited list serves only as a representative group and should not be interpreted as an exclusive list.

Any recitation of numerical ranges by endpoints includes all numbers subsumed within that range (e.g., 1 to 5 includes 1, 1.5, 2, 2.75, 3, 3.80, 4, 5, etc.).

The terms "a," "an," "the," "at least one," and "one or more" are used interchangeably. Thus, for example, "a" compound of Formula (I) can be interpreted to mean "one or more" compounds of Formula (I).

The compositions described herein can be used to form semiconductor layers using printing or coating techniques rather than costlier vapor deposition techniques. While some compositions are known for deposition of semiconductors from a solution or dispersion, many of the resulting semiconductor layers tend to be non-uniform. For example, when inkjet printing has been used to deliver a solution of an organic semiconductor dissolved in an organic solvent to a substrate and the solvent has been removed by evaporation, the concentration of the semiconductor material tends to be highest near the periphery of the deposit. More uniform semiconductor layers are needed. The compositions disclosed herein can often form more uniform semiconductor layers than those previously used for forming semiconductor layers. More specifically, the compositions disclosed herein tend to result in the deposition of semiconductors with a crystalline morphology that affords better electrical properties such as field effect mobility for thin film transistors.

A composition is provided that includes (a) a solvent mixture and (b) an organic semiconductor dissolved in the solvent mixture. The solvent mixture contains (i) an alkane having 6 to 16 carbon atoms and (ii) an aromatic compound of Formula (I).

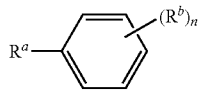
(I)

In Formula (I), the group $R^a$ is an alkyl, a heteroalkyl, an alkoxy, a heteroalkoxy, or a fused 5 to 6 member ring. Each group $R^b$ is independently selected from an alkyl, an alkoxy, or a halo. The variable n is an integer in the range of 0 to 5. The solvent mixture can include more than one alkane, more than one aromatic compound of Formula (I), or more than one alkane as well as more than one aromatic compound of Formula (I).

In some embodiments of Formula (I), $R^a$ is an alkyl group having at least 1 carbon atom. The alkyl group often has at least 2 carbon atoms, at least 3 carbon atoms, or at least 4 carbon atoms. The alkyl often has up to 10 carbon atoms, up to 8 carbon atoms, or up to 6 carbon atoms. For example, the alkyl group can have 1 to 10 carbon atoms, 2 to 10 carbon atoms, 3 to 10 carbon atoms, 4 to 10 carbon atoms, 2 to 8 carbon atoms, 2 to 6 carbon atoms, 3 to 6 carbon atoms, 3 to 5 carbon atoms, or 4 carbon atoms. The alkyl group can be linear, branched, cyclic, or a combination thereof. Non-limiting examples of alkyl groups include ethyl, n-propyl, isopropyl, n-butyl, isobutyl, sec-butyl, tent-butyl, n-pentyl, n-hexyl, 2-hexyl, cyclopropyl, cyclobutyl, cylcopentyl, cylcohexyl, and cyclohexylmethylene.

In other embodiments of Formula (I), $R^a$ is a heteroalkyl group having at least 2 carbon atoms. The heteroalkyl group has at least one heteroatom between two carbon atoms with the heteroatom being selected from an oxy (—O—), thio (—S—), or —NH— group. In many embodiments, the heteroatom is an oxy group (i.e., the heteroalkyl is an ether or polyether group). The heteroalkyl group can be linear, branched, cyclic, or a combination thereof. The heteroalkyl often has at least 3 carbon atoms or at least 4 carbon atoms. The heteroalkyl often has up to 10 carbon atoms, up to 8 carbon atoms, or up to 6 carbon atoms and up to 6 heteroatoms, up to 5 heteroatoms, or up to 4 heteroatoms. For example, the heteroalkyl can have 2 to 10 carbon atoms and 1 to 5 heteroatoms, 3 to 10 carbon atoms and 1 to 5 heteroatoms, 4 to 10 carbon atoms and 1 to 5 heteroatoms, 2 to 8 carbon atoms and 1 to 4 heteroatoms, 2 to 6 carbon atoms and 1 to 3 heteroatoms, 3 to 6 carbon atoms and 1 to 3 heteroatoms, 3 to 5 carbon atoms and 1 to 2 heteroatoms, or 4 carbon atoms and 1 to two heteroatoms. Non-limiting examples of heteroalkyl groups include methoxymethylene ($CH_3OCH_2$—), ethoxymethylene ($CH_3CH_2OCH_2$—), methoxyethylene ($CH_3OCH_2CH_2$—), and ethoxyethylene ($CH_3CH_2OCH_2CH_2$—).

In still other embodiments of Formula (I), $R^a$ is an alkoxy group (i.e., a group of formula —OR where R is an alkyl) having at least 1 carbon atom. For example, the alkoxy group can have at least 2 carbon atoms, at least 3 carbon atoms, or at least 4 carbon atoms. The alkoxy group often has up to 10 carbon atoms, up to 8 carbon atoms, or up to 6 carbon atoms. For example, the alkoxy group can have 1 to 10 carbon atoms, 2 to 10 carbon atoms, 1 to 8 carbon atoms, 2 to 8 carbon atoms, 1 to 6 carbon atoms, 2 to 6 carbon atoms, or 1 to 4 carbon atoms. The alkoxy group can be linear, branched, cyclic, or a combination thereof. Specific alkoxy groups include, but are not limited to, methoxy ($CH_3O$—), ethoxy ($CH_3CH_2O$—), n-propoxy ($CH_3CH_2CH_2O$—), isopropoxy (($CH_3)_2CHO$—), n-butoxy ($CH_3CH_2CH_2CH_2O$—), isobutoxy (($CH_3)_2CHCH_2O$—), tert-butoxy (($CH_3)_3CO$—), sec-butoxy ($CH_3CH_2CH(CH_3)O$—), n-pentoxy ($CH_3CH_2CH_2CH_2CH_2O$—), n-hexoxy ($CH_3CH_2CH_2CH_2CH_2O$—), isopentoxy (($CH_3)_2CHCH_2CH_2O$—), cylcohexoxy ($C_6H_{11}O$—), and cyclohexylmethyleneoxy ($C_6H_{11}$—$CH_2O$).

In yet other embodiments, $R^a$ can be any heteroalkoxy group (i.e., a group of formula —OR where R is a heteroalkyl). The heteroalkoxy group has at least one heteroatom between two carbon atoms. The heteroatom can be an oxy group, thio group, or —NH— group. In many embodiments, the heteroatom is an oxy group. The heteroalkoxy group can be linear, branched, cyclic, or a combination thereof. The heteroalkyloxy has at least two carbon atoms. The heteroalkoxy often has at least 3 carbon atoms, at least 4 carbon atoms, or at least 5 carbon atoms. Some heteroalkoxy groups have up to 10 carbon atoms, up to 8 carbon atoms, or up to 6 carbon atoms. More specifically, the heteroalkoxy group can have 2 to 10 carbon atoms and 2 to 5 heteroatoms, 2 to 8 carbon atoms and 2 to 4 heteroatoms, 2 to 6 carbon atoms and 2 to 3 heteroatoms, or 3 to 6 carbon atoms and 2 to 3 heteroatoms. Non-limiting examples of heteroalkoxy groups include ($CH_3OCH_2O$—), ($CH_3CH_2OCH_2O$—), ($CH_3OCH_2CH_2O$—), and ($CH_3CH_2OCH_2CH_2O$—).

In still other embodiments, $R^a$ can be a fused 5 to 6 member ring. That is, $R^a$ is a ring fused to the benzene ring of Formula (I). The fused ring can be carbocylic or can include a heteroatom selected from an oxy, thio, or —NH— group. The ring structure can be saturated or unsaturated. Exemplary aromatic compounds with a fused ring structure include, but are not limited to, benzofuran, 2,3-dihydrobenzofuran, and tetrahydronaphthalene.

In Formula (I), n is an integer of 0 to 5. In some embodiments, n is zero. If n is greater than zero, $R^b$ is independently selected from a halo group (e.g., chloro, bromo, fluoro, or iodo), an alkyl, or an alkoxy. Suitable alkyl groups for $R^b$ often have 1 to 4 carbon atoms. Exemplary alkyl groups include methyl, ethyl, n-propyl, isopropyl, n-butyl, sec-butyl, tent-butyl, and isobutyl. Suitable alkoxy groups for $R^b$ often have 1 to 4 carbon atoms. Exemplary alkoxy groups include methoxy, ethoxy, n-propoxy, isopropoxy, n-butoxy, isobutoxy, sec-butoxy, and tert-butoxy In some embodiments of Formula (I), $R^a$ is a methoxy group, each $R^b$ is independently a halo group, a methyl group, or a methoxy group, and the variable n is 0, 1, or 2. In some embodiments, the aromatic compound of Formula (I) is selected from anisole, 2-methylanisole, 3-methylanisole, 4-methylanisole, 2,3-dimethylanisole, 2,4-dimethylanisole, 2,5-dimethylanisole, 2,6-dimethylanisole, 3,4-dimethylanisole, 3,5-dimethylanisole, 2-chloroanisole, 3-chloroanisole, 4-chloroanisole, and 1,2-dimethoxybenzene. In some particular embodiments, the aromatic compound of Formula (I) is anisole. In other particular embodiments, the aromatic compound of Formula (I) is 3,5-dimethylanisole.

In other embodiments of Formula (I), $R^a$ is an alkyl group, the variable n is equal to 0, 1, or 2, and each $R^b$ is independently a halo group, a methyl group, or a methoxy group. For example, the compound of Formula (I) is selected from n-butylbenzene, sec-butylbenzene, tent-butylbenzene, isobutylbenzene, isopropyltoluene, n-propylbenzene, isopropylbenzene (cumene), and mesitylene. In some particular embodiments, the aromatic compound of Formula (I) is n-butylbenzene.

In addition to the aromatic compound of Formula (I), the solvent mixture includes at least one alkane. Some solvent mixtures include more than one alkane. The alkane can be linear, branched, cyclic, or a combination thereof. Suitable alkanes often have 6 to 16 carbon atoms. The alkane often has at least 8 carbon atoms, at least 9 carbon atoms, or at least 10 carbon atoms. The alkane often has no greater than 14 carbon atoms or no greater than 12 carbon atoms. In some embodiment, the alkane has 6 to 14 carbon atoms, 8 to 14 carbon atoms, 10 to 14 carbon atoms, 9 to 13 carbon atoms, 8 to 12 carbon atoms, or 10 to 12 carbon atoms. Non-limiting examples of alkanes include octane, iso-octane, cyclooctane, nonane, 2-methyloctane, 3-methyloctane, decane, 2-methylnonane, 3-methylnonane, 4-methylnonane, undecane, 2-methyldecane, 4-methyldecane, 5-methyldecane, dodecane, 2-methylundecane, tridecane, 3-methyldodecane, tetradecane, pentadecane, and hexadecane. In some embodiments, the alkane includes decane, undecane, dodecane, or mixtures thereof.

In some exemplary solvent mixtures, the aromatic compound of Formula (I) is selected from anisole, 3,5-dimethylanisole, n-butylbenzene, or a mixture thereof and the alkane is selected from decane, undecane, dodecane, or mixtures thereof. Some more specific solvent mixtures include anisole and decane, 3,5-dimethylanisole and dodecane, n-butylbenzene and decane, n-butylbenzene and undecane, and n-butylbenzene and dodecane.

The solvent mixture typically includes 1 to 20 weight percent of the alkane having 6 to 16 carbon atoms and 80 to 99 weight percent of the aromatic compound of Formula (I) based on the weight of the solvent mixture. For example, the solvent mixture can include 1 to 15 weight percent of the alkane and 85 to 99 weight percent of the aromatic compound of Formula (I), 1 to 12 weight percent of the alkane and 88 to 99 weight percent of the aromatic compound of Formula (I), 2 to 10 weight percent of the alkane and 90 to 98 weight percent of the aromatic compound of Formula (I), 3 to 10 weight percent of the alkane and 90 to 97 weight percent of the aromatic compound of Formula (I), 4 to 10 weight percent of the alkane and 90 to 96 weight percent of the aromatic compound of Formula (I), or 4 to 8 weight percent of the alkane and 92 to 96 weight percent of the aromatic compound of Formula (I).

Some exemplary solvent mixtures include 1 to 12 weight percent decane, undecane, dodecane, or a mixture thereof and 88 to 99 weight percent anisole, 3,5-dimethylanisole, n-butylbenzene, or a mixture thereof, 2 to 10 weight percent decane, undecane, dodecane, or a mixture thereof and 90 to 98 weight percent anisole, 3,5-dimethyl anisole, n-butylbenzene, or a mixture thereof, 3 to 10 weight percent decane, undecane, dodecane, or a mixture thereof and 90 to 97 weight percent anisole, 3,5-dimethyl anisole, n-butylbenzene, or a mixture thereof, 4 to 10 weight percent weight percent decane, undecane, dodecane, or a mixture thereof and 90 to 96 weight percent anisole, 3,5-dimethyl anisole, n-butylbenzene, or a mixture thereof, or 4 to 8 weight percent weight percent decane, undecane, dodecane, or a mixture thereof and 92 to 96 weight percent anisole, 3,5-dimethyl anisole, n-butylbenzene.

Some more specific exemplary solvent mixtures include 1 to 12 weight percent decane, undecane, dodecane, or a mixture thereof and 88 to 99 weight percent n-butylbenzene, 3 to 12 weight percent decane, undecane, dodecane, or a mixture thereof and 88 to 97 weight percent n-butylbenzene, 3 to 10 weight percent decane, undecane, dodecane, or a mixture thereof and 90 to 97 weight percent n-butylbenzene, 4 to 10 weight percent decane, undecane, dodecane, or a mixture thereof and 90 to 96 weight percent n-butylbenzene, or 4 to 8 weight percent decane, undecane, dodecane, or a mixture thereof and 92 to 96 weight percent n-butylbenzene based on the weight of the solvent mixture.

Other more specific exemplary solvent mixtures include 1 to 12 weight percent decane and 88 to 99 weight percent anisole, 3 to 12 weight percent decane and 88 to 97 weight percent anisole, 4 to 10 weight percent decane and 90 to 96 weight percent anisole, or 6 to 10 weight percent decane and 90 to 94 weight percent anisole based on the weight of the solvent mixture.

Still other more specific exemplary solvent mixtures include 1 to 12 weight percent dodecane and 88 to 99 weight percent 3,5-dimethylanisole, 1 to 10 weight percent dodecane and 90 to 99 weight percent 3,5-dimethylanisole, 2 to 8 weight percent dodecane and 92 to 98 weight percent 3,5-dimethylanisole, or 3 to 6 weight percent dodecane and 94 to 97 weight percent 3,5-dimethylanisole based on the weight of the solvent mixture.

The composition can include any suitable weight percentage of solvent mixture, based on the total weight of the composition. The composition often contains at least 70 weight percent, at least 80 weight percent, at least 90 weight percent, or at least 95 weight percent solvent mixture based on the total weight percentage of the composition. The composition can contain no greater than 99.9 weight, no greater than 99.5 weight, no greater than 99 weight, no greater than 98.5 weight percent, no greater than 98.2 weight, no greater than 98 weight percent, no greater than 97 weight percent, no greater than 96 weight percent, no greater than 95 weight percent, no greater than 90 weight percent, or no greater than 80 weight percent solvent mixture based on the total weight of the composition.

The composition includes at least one organic semiconductor material dissolved in the solvent mixture. The amount of dissolved semiconductor material in the composition depends on the particular semiconductor material and the particular solvent mixture. The solubility of the organic semiconductor can be greater in the solvent mixture or composition (e.g., as measured as a weight percentage) than in any one of the solvents included in the solvent mixture. The composition typically includes at least 0.1 weight percent organic semiconductor dissolved in the solvent mixture. Stated differently, the composition contains at least 0.1 weight percent dissolved organic semiconductor based on a total weight of the composition. For example, the composition can contain at least 0.2 weight percent, at least 0.4 weight percent, at least 0.5 weight percent, at least 0.6 weight percent, at least 0.8 weight percent, or at least 1.0 weight percent dissolved organic semiconductor material. In some examples, the composition contains up to 25 weight percent, up to 20 weight percent, up to 15 weight percent, up to 10 weight percent, up to 8 weight percent, up to 6 weight percent, up to 5 weight percent, or up to 4 weight percent dissolved organic semiconductor material based on the total weight of the composition. For example, some compositions contain 0.1 to 25 weight percent, 0.1 to 20 weight percent, 0.1 to 10 weight percent, 0.1 to 5 weight percent, 0.5 to 5 weight percent, 0.5 to 3 weight percent, 0.1 to 3 weight percent, 0.5 to 2 weight percent, or 0.1 to 2 weight percent dissolved organic semiconductor material based on the total weight of the composition.

Any organic semiconductor material that can be dissolved in the solvent mixture can be used. Non-limiting examples of organic semiconductors include acenes, heteroacenes, perylenes such as perlyene-3,4,9,10-tetracarboxylic diimides, buckminsterfullerenes substituted with various organo groups such as the compound [6,6]-phenyl-$C_{61}$-butyric acid methyl ester, polythiophenes, polypyrroles, polyacetylenes, poly(phenylene vinylenes), and poly(thienylene vinylenes). In some embodiments, the organic semiconductor comprises an organometallic compound such as a phthalocyanine Non-limiting examples of organic semiconductors include those described in, for example, U.S. Pat. No. 6,690,029 (Anthony et al.), U.S. Pat. No. 7,319,153 (Vogel et al.), U.S. Pat. No. 7,211,679 (Gerlach et al.), U.S. Pat. No. 6,864,396 (Smith et al.), U.S. Patent Application Publication Nos. 2007/0158643 (Vogel et al.), 2007/0249087 (Zhu et al.), 2007/0146426 (Nelson, et al.), and 2007/0249802 (Zhu et al.), and 2007/0232781 (Zhu et al.).

In some embodiments, the organic semiconductor includes a substituted pentacene. Exemplary substituted pentacenes include those of Formula (II).

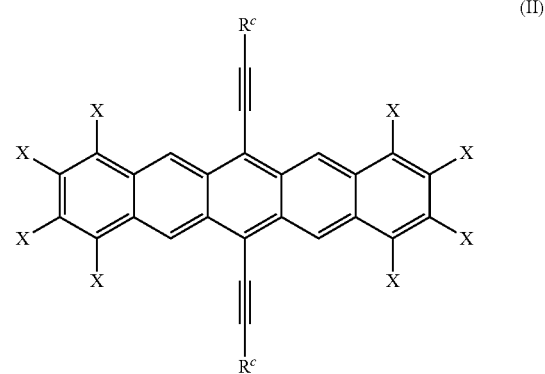

In Formula (II), each $R^c$ is independently selected from an unsubstituted or substituted alkyl, an unsubstituted or substituted heteroalkyl, an unsubstituted or substituted alkenyl, an unsubstituted or substituted aryl, an unsubstituted or substituted heteroaryl, a ferrocenyl, or a silyl group of formula —Si(R$^d$)$_3$. Each R$^d$ is independently selected from hydrogen, an unsubstituted or substituted alkyl, an unsubstituted or substituted heteroalkyl, an unsubstituted or substituted alkenyl, an unsubstituted or substituted alkynyl, a substituted or unsubstituted aryl, an unsubstituted or substituted heteroaryl, or acetyl. Suitable substituents for an alkyl or heteroalkyl groups include an aryl, heteroaryl, halo, cyano, hydroxyl, or carboxyl group (i.e., —COOH). Suitable substituents for alkenyl, and alkynyl groups include alkoxy, aryl, heteroaryl, halo, cyano, hydroxyl, or carboxyl group (i.e., —COOH). Suitable substituents for an aryl or heteroaryl include an alkyl, alkoxy, heteroalkyl, halo, cyano, hydroxyl, —SeH, or carboxyl group. Each X is independently selected from hydrogen, halo, alkyl, alkoxy, aryl, heteroaryl, alkenyl, cyano, or heteroalkyl. The amount of the organic semiconductor material dissolved in the solvent mixture is equal to at least 0.1 weight percent based on a total weight of the composition.

In Formula (II), suitable alkyl R$^c$ groups typically have 1 to 18 carbon atoms. For example, the alkyl group can have 2 to 12 carbon atoms, 2 to 10 carbon atoms, 2 to 8 carbon atoms, 2 to 6 carbon atoms, or 3 to 6 carbon atoms. The alkyl group can be linear, branched, cyclic, or a combination thereof. Non-limiting examples of alkyl groups include ethyl, propyl, butyl, pentyl, hexyl, cyclohexyl, octyl, cyclooctyl, nonyl, decyl, undecyl, dodecyl, tetradecyl, hexadecyl, and octadecyl groups. Any of these alkyl groups can be optionally substituted with an aryl, heteroaryl, halo, cyano, hydroxyl or carboxyl group. Suitable aryl substituents often have 6 to 12 carbon atoms. Suitable heteroaryl substituents often have 3 to 10 carbon atoms and 1 to 3 heteroatoms selected from oxygen, sulfur, or nitrogen.

Suitable heteroalkyl R$^c$ groups typically have 2 to 18 carbon atoms and 1 to 10 heteroatoms selected from oxy, thio, or —NH—. For example, the heteroalkyl has 1 to 12 carbon atoms and 1 to 6 heteroatom, 1 to 10 carbon atoms and 1 to 5 heteroatoms, 1 to 6 carbon atoms and 1 to 3 heteroatoms, or 1 to 4 carbon atoms and 1 to 2 heteroatom. The heteroalkyl is often an ether or polyether group; that is, each heteroatom can be an oxy. Non-limiting examples of heteroalkyl groups include methoxymethylene (CH$_3$OCH$_2$—), ethoxymethylene (CH$_3$CH$_2$OCH$_2$—), methoxyethylene (CH$_3$OCH$_2$CH$_2$—), and ethoxyethylene (CH$_3$CH$_2$OCH$_2$CH$_2$—). Any of these heteroalkyl groups can be optionally substituted with an aryl, heteroaryl, halo, cyano, hydroxyl or carboxyl group. Suitable aryl substituents often have 6 to 12 carbon atoms. Suitable heteroaryl substituents often have 3 to 10 carbon atoms and 1 to 3 heteroatoms selected from oxygen, sulfur, or nitrogen.

Suitable alkenyl R$^c$ groups typically have 2 to 18 carbon atoms. For example, the alkenyl group can have 2 to 16 carbon atoms, 2 to 12 carbon atoms, 2 to 10 carbon atoms, 2 to 8 carbon atoms, or 2 to 6 carbon atoms. The alkenyl group can be linear, branched, cyclic, or a combination thereof. Non-limiting examples of alkenyl groups include vinyl, allyl, isopropenyl, 1-butenyl, 1-hexenyl, 2-hexenyl, 1-octenyl, 1-decenyl, 2-decenyl, 3-decenyl, 1-dodecenyl, 1-tetradecenyl, and 1-octadecenyl groups. Any of these alkenyl groups can be optionally substituted with an alkoxy, aryl, heteroaryl, halo, cyano, hydroxyl or carboxyl group. Suitable aryl substituents often have 6 to 12 carbon atoms or 6 to 10 carbon atoms. Suitable heteroaryl substituents often have 3 to 10 carbon atoms or 4 to 8 carbon atoms and 1 to 3 heteroatoms selected from oxygen, sulfur, or nitrogen.

Suitable aryl R$^c$ groups typically have 6 to 12 carbon atoms. For example, the aryl group often has 6 to 10 carbon atoms or 6 to 8 carbon atoms. The aryl group can include a single aromatic ring, a first aromatic ring fused to a second carbocyclic aromatic ring, or a first aromatic ring fused to a non-aromatic carbocyclic ring. Non-limiting examples of aryl groups having 6 to 12 carbon atoms include phenyl, 1-naphthyl, and 2-naphthyl. Any of these aryl groups can be optionally substituted with an alkyl, alkoxy, heteroalkyl, halo, cyano, hydroxyl, —SeH, or carboxyl group. Suitable alkyl substituents often have 1 to 10 carbon atoms, 1 to 6 carbon atoms, or 1 to 4 carbon atoms. Non-limiting examples of aryl groups substituted with one or more alkyl groups include 2-methylphenyl, 4-methylphenyl, 3,5-dimethylphenyl, 2,4,6-trimethylphenyl, 4-butylphenyl, 2-hexylphenyl, and 4-hexylphenyl. Suitable heteroalkyl substituents often have 2 to 10 carbon atoms, 2 to 6 carbon atoms, or 2 to 4 carbon atoms and 1 to 3 heteroatoms selected from oxy, thio, or —NH—.

Suitable heteroaryl R$^c$ groups typically have 3 to 10 carbon atoms and 1 to 3 heteroatoms atoms selected from oxygen, sulfur, or nitrogen. For example, the heteroaryl often has 3 to 8 carbon atoms, 4 to 8 carbon atoms, or 4 to 6 carbon atoms and 1 to 3 heteroatoms or 1 to 2 heteroatoms. The heteroaryl can include a single heteroaromatic ring, a heteroaromatic ring fused to a carbocyclic aromatic ring, or a heteroaromatic ring fused to a carbocyclic non-aromatic ring. Non-limiting examples of heteroaryl groups include 2-pyridinyl, 3-pyridinyl, 4-pyridinyl, 2-pyrrolyl, 3-pyrrolyl, 2-furanyl, 3-furanyl, 2-thienyl, and 3-thienyl. Any of these heteroaryl groups can be optionally substituted with an alkyl, alkoxy, heteroalkyl, halo, cyano, hydroxyl, —ScH, or carboxyl group. Suitable alkyl substituents often have 1 to 10 carbon atoms, 1 to 6 carbon atoms, or 1 to 4 carbon atoms. Suitable heteroalkyl substituents often have 2 to 10 carbon atoms, 2 to 6 carbon atoms, or 2 to 4 carbon atoms and 1 to 3 heteroatoms selected from oxy, thio, or —NH—.

Suitable ferrocenyl groups for R$^c$ include, but are not limited to, ferrocenyl, methylferrocenyl, dimethylferrocenyl, tetramethylferrocenyl, pentamethylferrocenyl, and nonamethylferrocenyl.

Suitable silyl groups for R$^c$ are of formula —Si(R$^d$)$_3$. Each R$^d$ is independently selected from hydrogen, unsubstituted or substituted alkyl, unsubstituted or substituted heteroalkyl, unsubstituted or substituted alkenyl, unsubstituted or substituted alkynyl, unsubstituted or substituted aryl, unsubstituted or substituted heteroaryl, or acetyl. Suitable substituents for an alkyl or heteroalkyl include an aryl, heteroaryl, halo, cyano, hydroxyl, or carboxyl group (i.e., —COOH). Suitable substituents for an alkenyl or alkynyl include alkoxy, aryl, heteroaryl, halo, cyano, hydroxyl or carboxyl. Suitable substituents for an aryl or heteroaryl include an alkyl, alkoxy, heteroalkyl, halo, cyano, hydroxyl, —SeH, or carboxyl group.

Suitable alkyl groups for R$^d$ typically have 1 to 10 carbon atoms. For example, the alkyl can have 1 to 8 carbon atoms, 1 to 6 carbon atoms, 1 to 4 carbon atoms, 2 to 10 carbon atoms, 2 to 8 carbon atoms, or 2 to 6 carbon atoms. These groups can be linear, branched, cyclic, or mixtures thereof. Cyclic alkyl groups are referred herein as "cycloalkyl" groups. Alkyl group having a cyclic portion plus a linear or branched portion are referred herein as "cylcoalkylalkylene" groups. Non-limiting examples of alkyl groups having 1 to 10 carbon atoms include methyl, ethyl, propyl, isopropyl, cyclopropyl, butyl, cyclobutyl, pentyl, cyclopentyl, hexyl, cyclohexyl, octyl, cyclooctyl, nonyl, and decyl groups. Further non-limiting examples include cyclopropylmethylene, 2,3-dimethylcyclopropyl, and 2,2,3,3,-tetramethylcyclopropyl. Any of these alkyl groups can be optionally substituted with an aryl, heteroaryl, halo, cyano, hydroxyl or carboxyl group. Suitable aryl substituents often have 6 to 12 carbon atoms. Suitable heteroaryl substituents often have 3 to 10 carbon atoms and 1 to 3 heteroatoms selected from oxygen, sulfur, or nitrogen. An example of an alkyl substituted with an aryl, which can be referred to interchangeably as an "arylalkylene" or "arylalkyl", is benzyl.

Suitable heteroalkyl groups for $R^d$ typically have 1 to 10 carbon atoms and 1 to 3 heteroatoms selected from oxy, thio, or —NH—. For example, the heteroalkyl can have 1 to 8 carbon atoms and 1 to 3 heteroatoms, 1 to 6 carbon atoms and 1 to 3 heteroatoms, or 1 to 4 carbon atoms and 1 to 2 heteroatoms. The heteroalkyl is often an ether or polyether group; that is, each heteroatom is an oxy. Non-limiting examples of heteroalkyl groups include methoxymethylene ($CH_3OCH_2$—), ethoxymethylene ($CH_3CH_2OCH_2$—), methoxyethylene ($CH_3OCH_2CH_2$—), and ethoxyethylene ($CH_3CH_2OCH_2CH_2$—). Any of these heteroalkyl groups can be optionally substituted with an aryl, heteroaryl, halo, cyano, hydroxyl or carboxyl group. Suitable aryl substituents often have 6 to 12 carbon atoms. Suitable heteroaryl substituents often have 3 to 10 carbon atoms and 1 to 3 heteroatoms selected from oxy, thio, or —NH—.

Suitable alkenyl and alkynyl groups for $R^d$ typically have 2 to 10 carbon atoms. For example, the alkenyl and alkynyl groups can have 2 to 8 carbon atoms, 2 to 6 carbon atoms, or 2 to 4 carbon atoms. These groups can be linear, branched, cyclic, or mixtures thereof. Non-limiting examples of alkenyl groups include vinyl, allyl, isopropenyl, 1-butenyl, 2-but-1-enyl, cis-2-but-2-enyl, 3-but-1-enyl, 1-hexenyl, 2-hexenyl, 1-octenyl, and 1-decenyl groups. Non-limiting examples of alkynyl groups include ethynyl, propynyl, and n-butynyl. Any of these alkenyl or alkynyl groups can be optionally substituted with an alkoxy, aryl, heteroaryl, halo, cyano, hydroxyl, or carboxyl group. Suitable aryl substituents often have 6 to 12 carbon atoms. Suitable heteroaryl substituents often have 3 to 10 carbon atoms and 1 to 3 heteroatoms selected from oxygen, sulfur, or nitrogen.

The same aryl and heteroaryl groups described for $R^c$ can be used for $R^d$. Suitable aryl groups often have 6 to 12 carbon atoms or 6 to 10 carbon atoms. Phenyl is an exemplary aryl group. Suitable heteroaryl group often have 3 to 10 carbon atoms and 1 to 3 heteroatoms or 3 to 8 carbon atoms and 1 to 3 heteroatoms. Non-limiting examples of heteroaryl groups include 2-pyridinyl, 3-pyridinyl, 4-pyridinyl, 2-pyrrolyl, 3-pyrrolyl, 2-furanyl, 3-furanyl, 2-thienyl, and 3-thienyl. Any of these aryl or heteroaryl groups can be optionally substituted with an alkyl, alkoxy, heteroalkyl, halo, cyano, hydroxyl, —SeH, or carboxyl group. An example of an aryl substituted with an alkyl is tolyl. An example of a heteroaryl substituted with an alkyl is N-methylpyrrol-2-yl.

In some embodiments, the silyl group of formula of formula —Si($R^d$)$_3$ is of formula —Si(R')$_x$(R")$_y$(R''')$_z$. Each R' independently is selected from (a) an unsubstituted or substituted alkyl, (b) an unsubstituted or substituted cycloalkyl, or unsubstituted or substituted cycloalkylalkylene. Each R" independently is selected from (a) an unsubstituted or substituted alkenyl, (b) an unsubstituted or substituted cycloalkyl, or (c) an unsubstituted or substituted cycloalkylalkylene. R''' is selected from (a) hydrogen, (b) an unsubstituted or substituted alkynyl, (c) an unsubstituted or substituted cycloalkyl, (d) an unsubstituted or substituted arylalkylene, (e) an acetyl, or (f) a heteroaryl. The variable x is equal to 1 or 2, the variable y is equal to 1 or 2, and the variable z is equal to 0 or 1. The sum of x+y+z is equal to 3.

In some silyl groups of formula —Si($R^d$)$_3$, each $R^d$ group is independently selected from an alkenyl group having no greater than 4 carbon atoms and an alkyl group having no greater than 4 carbon atoms. These groups can be linear, branched, cyclic, or combinations thereof. Non-limiting examples of such compounds are compounds of Formulas (IV), (V), (VI), (VII), (VIII), (IX), and (X).

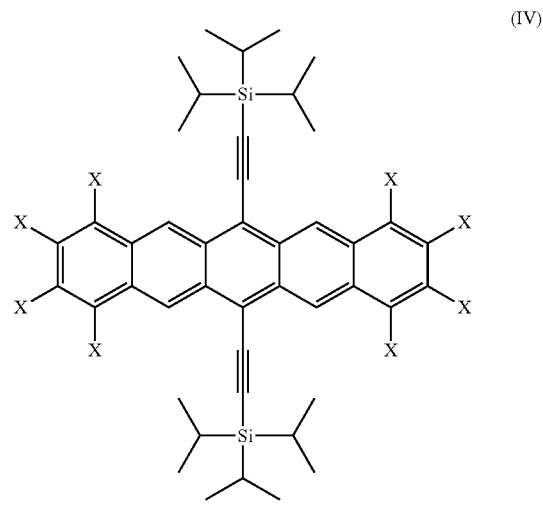

(IV)

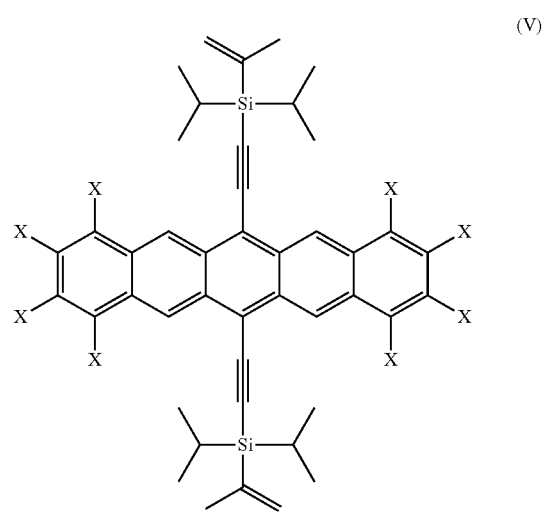

(V)

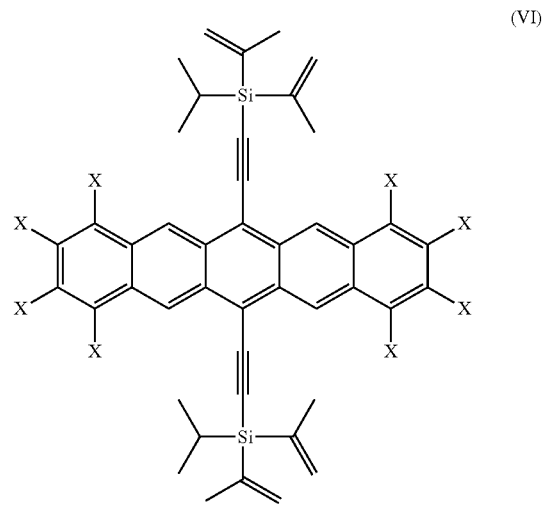

(VI)

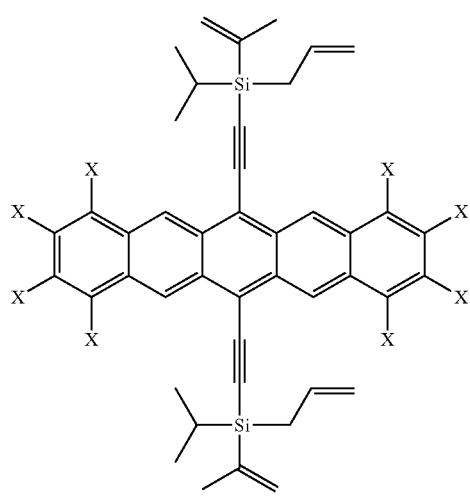
(VII)

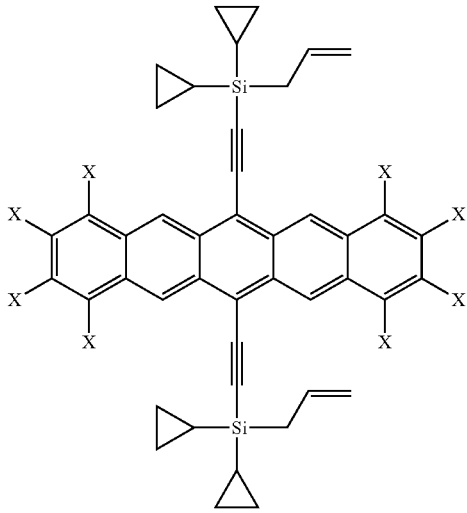
(X)

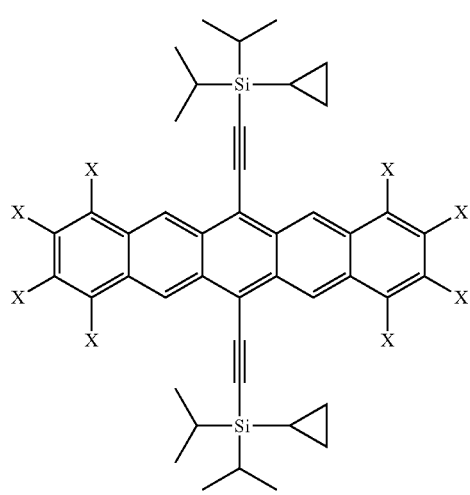
(VIII)

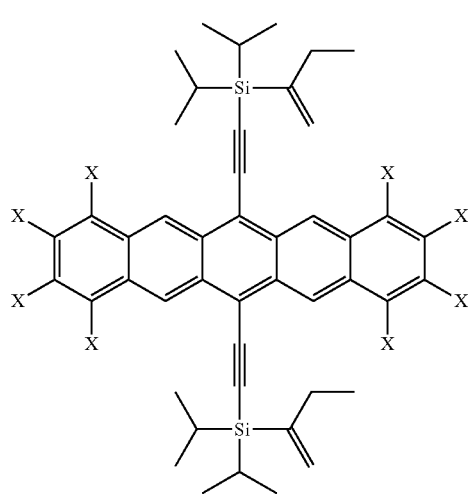
(IX)

These compounds all have silyl groups of formula —Si(R$^d$)$_3$ that are also of formula —Si(R)$_x$(R")$_y$(R'")$_z$. Each silyl group in the compounds of Formula (IV) and Formula (VIII) has three alkyl R$^d$ groups. All three alkyl groups are branched in Formula (IV). In Formula (VIII), two alkyl groups are branched and one alkyl group is cyclic. Each silyl group in the compounds of Formula (V), Formula (VII), Formula (IX) and Formula (X) has one alkenyl R$^d$ group and two alkyl R$^d$ groups. The two alkyl groups in Formulas (V), (VII), and (IX) are branched while the two alkyl groups in Formula (X) are cyclic. The alkenyl group is linear in Formulas (VII) and (X) but branched in Formulas (V) and (IX). Each silyl group in the compound of Formula (VI) has two alkenyl R$^d$ groups and one alkyl R$^d$ group. The alkenyl and alkyl groups are all branched in this formula. In many of these compounds, each group X on the outrmost rings of the acene group is hydrogen.

In addition to the semiconductor material dissolved in the solvent mixture, the composition can further include a polymer. The polymer can be a homopolymer, copolymer, terpolymer, or the like. The polymer is often added to modify the rheology of the composition or to improve the mechanical properties of a semiconductor layer formed from the composition.

In some embodiments, the polymer is completely dissolved in the composition. In other embodiments, the polymer is partially dissolved in the composition. As used herein, the term "partially dissolved" can mean that the solubility of the polymer in the solvent mixture or in the composition is exceeded or that the polymer contains a component or impurity that is not completely dissolved in the solvent mixture or composition. For example, in some embodiments, at least 98 weight percent, at least 99 weight percent, at least 99.5 weight percent, at least 99.8 weight percent, or at least 99.9 weight percent of the polymer is dissolved in the composition. In still other embodiments, the polymer is dispersed in the composition. For example, at least 98 weight percent, at least 99 weight percent, at least 99.5 weight percent, at least 99.8 weight percent, or at least 99.9 weight percent of the polymer is dispersed in the composition. In still other embodiments, a first portion of the polymer is dissolved in the composition and a second portion is dispersed in the composition. For example, at least 98 weight percent, at least 99 weight percent, at least 99.5 weight percent, at least 99.8 weight percent, or at least 99.9 weight percent of the polymer is dispersed or dissolved in the composition.

Although any suitable polymer can be included in the composition, the polymer is often an insulating polymer (i.e., the polymer is an electrical insulator). In some embodiments, insulating polymers can be free or substantially free of conjugated carbon-carbon double bonds along the backbone of the polymer. That is, the insulating polymers can be non-conductive over the length of the polymeric chain. The insulating polymer, however, can have regions with conjugated carbon-carbon double bonds. For example, the insulating polymer can have pendant conjugated aromatic groups. In other embodiments, the insulating polymer has an aliphatic structure and has few, if any, carbon-carbon double bonds along the backbone of the polymer or in pendant groups.

The polymer can be an amorphous polymer (i.e., the polymer exhibits no crystalline melting point when analyzed, for example, by differential scanning calorimetry). Exemplary polymers include, but are not limited to, polystyrene, poly($\alpha$-methylstyrene), poly(4-methylstyrene), poly(methyl methacrylate), polyvinylphenol, poly(vinyl alcohol), poly(vinyl acetate), poly(vinyl chloride), polyvinylidene fluoride, cyanoethylpullulan, poly(divinyltetramethyldisiloxane-bis(benzocyclobutene)), styrene-butadiene block copolymers, hydrogenated styrene-butadiene block copolymers, partially hydrogenated styrene-butadiene block copolymers, styrene-isoprene block copolymers, hydrogenated styrene-isoprene block copolymers, partially hydrogenated styrene-isoprene block copolymers, and the like.

The polymer can have any weight average molecular weight. The weight average molecular weight of the polymer can have an effect on the viscosity of the composition. Polymers with a higher molecular weight usually result in coating compositions with higher viscosity. In some embodiments, the weight average molecular weight of the polymer is at least 1000 grams/mole, at least 2000 grams/mole, at least 5000 grams/mole, at least 10,000 grams/mole, at least 20,000 grams/mole, at least 50,000 grams/mole, or at least 100,000 grams/mole. The weight average molecular weight is often no greater than 1,000,000 grams/mole, no greater than 500,000 grams/mole, no greater than 200,000 grams/mole, or no greater than 100,000 grams/mole. For example, the weight average molecular weight can be in the range of 1000 to 1,000,000 grams/mole, in the range of 2000 to 500,000 grams/mole, or in the range of 2000 to 200,000 grams/mole.

The concentration of the polymer in the composition can be at least 0.1 weight percent, at least 0.2 weight percent, at least 0.5 weight percent, or at least 1.0 weight percent based on the total weight of the composition. The concentration of the polymer in the composition is often no greater than 20 weight percent, no greater than 15 weight percent, no greater than 10 weight percent, no greater than 5 weight percent, no greater than 4 weight percent, no greater than 3 weight percent, or no greater than 2 weight percent based on the total weight of the composition. For example, the composition can include 0.1 to 20 weight percent, 0.1 to 10 weight percent, 0.1 to 5 weight percent, 0.1 to 3 weight percent, 0.5 to 5 weight percent, or 0.5 to 3 weight percent polymer based on the total weight of the composition.

The composition can contain any weight ratio of the organic semiconductor to the polymer. In some embodiments, the weight ratio of the organic semiconductor to the polymer is in the range of 1:10 to 20:1, in the range of 1:10 to 10:1, in the range of 1:8 to 8:1, in the range of 1:5 to 5:1, in the range of 1:4 to 4:1, in the range of 1:3 to 3:1, or in the range of 1:2 to 2:1.

The compositions often contain 0.1 to 25 weight percent organic semiconductor material, 0 to 20 weight percent polymer, and 55 to 99.9 weight percent solvent mixture based on the total weight of the composition. In some examples, the composition can contain 0.1 to 20 weight percent organic semiconductor material, 0 to 10 weight percent polymer, and 70 to 99.9 weight percent solvent mixture. In other examples, the compositions can contain 0.1 to 10 weight percent organic semiconductor, 0 to 5 weight percent polymer, and 85 to 99.9 weight percent solvent mixture. In still other examples, the compositions can contain 0.5 to 10 weight percent organic semiconductor, 0 to 5 weight percent polymer, and 85 to 99.5 weight percent solvent mixture. In still other examples, the composition can contain 0.5 to 5 weight percent organic semiconductor, 0.5 to 5 weight percent polymer, and 90 to 99 weight percent solvent mixture. In any of these examples, the solvent mixture contains 1 to 20 weight percent alkane having 6 to 16 carbon atoms and 80 to 99 weight percent of the aromatic compound of Formula (I), 1 to 12 weight percent alkane having 8 to 14 carbon atoms and 88 to 99 weight percent of the aromatic compound of Formula (I), or 1 to 10 weight percent alkane having 9 to 13 carbon atoms and 90 to 99 weight percent of the aromatic compound of Formula (I).

Some more specific compositions contain 0.1 to 10 weight percent semiconductor of Formula (II), 0 to 5 weight percent of a polymer such as an insulating polymer, and 85 to 99.9 weight percent solvent mixture with the solvent mixture being 1 to 12 weight percent alkane having 6 to 16 carbon atoms and 88 to 99 weight percent of the aromatic compound of Formula (I). For example, the composition can contain 0.5 to 10 weight percent semiconductor of Formula (II), 0 to 5 weight percent of a polymer such as an insulating polymer, and 85 to 99.5 weight percent solvent mixture with the solvent mixture being 1 to 12 weight percent alkane having 6 to 16 carbon atoms and 88 to 99 weight percent of the aromatic compound of Formula (I). In other examples, the composition can contain 0.5 to 5 weight percent semiconductor of Formula (II), 0.5 to 5 weight percent of a polymer such as an insulating polymer, and 90 to 99 weight percent solvent mixture with the solvent mixture being 1 to 12 weight percent alkane having 6 to 16 carbon atoms and 88 to 99 weight percent of the aromatic compound of Formula (I). In still other examples, the composition can contain 0.5 to 5 weight percent semiconductor of Formula (II), 0.5 to 5 weight percent of a polymer such as an insulating polymer, and 90 to 99 weight percent solvent mixture with the solvent mixture being 1 to 10 weight percent alkane having 8 to 14 carbon atoms and 90 to 99 weight percent of the aromatic compound of Formula (I).

In some even more specific examples, the compositions contain 0.1 to 10 weight percent semiconductor of Formula (II) where $R^c$ is a silyl of formula —$Si(R^d)_3$, 0 to 5 weight percent of a polymer such as an insulating polymer, and 85 to 99.9 weight percent solvent mixture with the solvent mixture being 1 to 12 weight percent alkane having 9 to 13 carbon atoms and 88 to 99 weight percent of the aromatic compound of Formula (I). For example, the composition can contain 0.1 to 10 weight percent semiconductor of Formula (II) where $R^c$ is a silyl of formula —$Si(R^d)_3$, 0 to 5 weight percent of a polymer such as an insulating polymer, and 85 to 99.9 weight percent solvent mixture with the solvent mixture being 1 to 10 weight percent alkane having 9 to 13 carbon atoms and 90 to 99 weight percent of the aromatic compound of Formula (I). In other examples, the composition can contain 0.1 to 10 weight percent semiconductor of Formula (II) where $R^c$ is a silyl of formula —$Si(R^d)_3$, 0 to 5 weight percent of a polymer such as an insulating polymer, and 85 to 99.9 weight percent solvent mixture with the solvent mixture being 3 to 10 weight percent alkane having 9 to 13 carbon atoms and 90 to 97 weight percent of the aromatic compound of Formula (I).

In still other examples, the composition can contain 0.1 to 10 weight percent semiconductor of Formula (II) where $R^c$ is a silyl of formula —$Si(R^d)_3$, 0 to 5 weight percent of a polymer such as an insulating polymer, and 85 to 99.9 weight percent solvent mixture with the solvent mixture being 1 to 12 weight percent alkane selected from decane, undecane, dodecane, or a mixture thereof and 88 to 99 weight percent of an aromatic compound selected from anisole, 3,5-dimethylanisole, n-butylbenzene, or a mixture thereof. These examples can contain 0.1 to 10 weight percent semiconductor of Formula (II) where $R^c$ is a silyl of formula —$Si(R^d)_3$, 0 to 5 weight percent of a polymer such as an insulating polymer, and 85 to 99.9 weight percent solvent mixture with the solvent mixture being 1 to 10 weight percent alkane selected from decane, undecane, dodecane, or a mixture thereof and 90 to 99 weight percent of an aromatic compound selected from anisole, 3,5-dimethylanisole, n-butylbenzene, or a mixture thereof. These examples can also contain 0.1 to 10 weight percent semiconductor of Formula (II) where $R^c$ is a silyl of formula —$Si(R^d)_3$, 0 to 5 weight percent of a polymer such as an insulating polymer, and 85 to 99.9 weight percent solvent mixture with the solvent mixture being 3 to 10 weight percent alkane selected from decane, undecane, dodecane, or a mixture thereof and 90 to 97 weight percent of an aromatic compound selected from anisole, 3,5-dimethylanisole, n-butylbenzene, or a mixture thereof.

The composition can be prepared by combining an aromatic compound of Formula (I), an alkane, an organic semiconductor, and an optional polymer in any order. For example, an aromatic compound of Formula (I) can be combined with an alkane to prepare a solvent mixture, and the resulting solvent mixture can then be combined with an organic semiconductor and any optional polymer. When the composition includes an optional polymer, the polymer can be added as a neat polymer, as a solution with the polymer dissolved in any suitable organic solvent, as a dispersion with the polymer dispersed in any suitable organic solvent, or as a combination thereof.

In some embodiments, the solvent mixture is prepared and then combined with the organic semiconductor material and optional polymer with stirring, agitation, or shaking at ambient temperatures (e.g., about 20 to 30° C.). In other embodiments, the solvent mixture is prepared, combined with the organic semiconductor and optional polymer, and then heated to a temperature above ambient temperature with stirring, agitation, or shaking The heating can be under an inert atmosphere (e.g., an atmosphere having less than 21 percent oxygen, less than 15 percent oxygen, less than 10 percent oxygen, less than 5 percent oxygen, or less than 1 percent oxygen, or less than 0.1 percent oxygen). The resulting compositions can be stored before use in the dark.

In another aspect, a method of making a semiconductor device is provided. The method includes providing a composition that contains (a) a solvent mixture and (b) an organic semiconductor material dissolved in the solvent mixture in an amount equal to at least 0.1 weight percent based on the weight of the composition. The solvent mixture contains (i) an alkane having 6 to 16 carbon atoms present in an amount in a range of 1 to 20 weight percent based on a weight of the solvent mixture and (ii) an aromatic compound of Formula (I) present in an amount in a range of 80 to 99 weight percent based on the weight of the solvent mixture. The method further includes depositing the composition adjacent to one or more conductive materials or adjacent to a dielectric material to form a deposited layer and then removing at least 80 weight percent of the solvent mixture from the deposited layer to form a semiconductor layer.

As used herein, the term "adjacent" with reference to a first layer and a second layer means that the first layer is in close proximity to the second layer. The two layers can be in contact or can be separated by one or more intervening layers such as an adhesive layer, primer layer, or both. In many embodiments, when the first layer is adjacent to the second layer, the first layer contacts the second layer. More specifically, in many embodiments, the deposited layer and the resulting semiconductor layer are in contact with one or more conductive layers or in contact with a dielectric material.

In one example of this method, the semiconductor device is a transistor such as a thin film transistor. Transistors with an organic semiconductor are described in, for example, U.S. Patent Application Publication Nos. 2007/0158643 (Vogel et al.), 2007/0146426 (Nelson et al.), 2004/0222412 (Bai et al.), 2007/0146426 (Nelson et al.), and 2007/0249087 (Zhu et al.). Transistors often have multiple layers of different material that serve different functions. For example, there is often a base substrate that can be rigid (e.g., a silicon wafer) or flexible (e.g., poly(ethylene naphthalate) or poly(ethylene terephthalate) film). Additionally, there are usually dielectric materials as well as conductive materials such as the gate, source, and drain electrodes.

The method of making a transistor includes providing any of the compositions described above and then depositing the composition on a structure that includes a source electrode and a drain electrode. That is, the composition is deposited adjacent to (e.g., on or in contact with) both the source electrode and the drain electrode. Alternatively, the method includes providing any of the compositions described above and then depositing the composition adjacent to (e.g., on or in contact with) a dielectric layer. After depositing the composition, at least 80 weight percent of the solvent mixture is removed resulting in the formation of the semiconductor layer.

Any suitable method of forming the deposited layer can be used. In some embodiments, the deposited layer is formed using inkjet printing (i.e., the composition is deposited onto a conductive material or dielectric material using an inkjet print head). Inkjet printing methods are further described, for example, in U.S. Patent Application Publication No. 2007/0146426 (Nelson, et al.). In other embodiments, the deposited layer is formed using knife coating or spin coating (i.e., the composition is applied to conductive material or dielectric material and is then spread to a thin layer by using a knife coating blade or by spinning the structure to distribute the composition over it). Knife coating and spin coating are further described, for example, in U.S. Patent Application Publication No. 2007/0158643 (Vogel, et al.). In still other embodiments, the deposited layer is formed using dip coating (i.e., dipping a structure into the composition). Other suitable methods of forming the deposited layer include, but are not limited to, flexographic printing, gravure printing, and micropipetting. The surface on which the deposited layer is formed can be provided from a roll (i.e., the composition can be deposited on a surface of a flexible substrate or on the surface of one of more other layers deposited on a flexible substrate).

The solvent mixture in the deposited layer is removed to form the semiconductor layer. Any suitable method can be used to remove the solvent mixture (i.e., dry) in the deposited layer. In many embodiments, the solvent mixture is removed by evaporation. The various solvents included in the solvent mixture (e.g., the aromatic compound of Formula (I) and the alkane) can evaporate at the same rate or different rates. In some examples, the aromatic compound of Formula (I) can evaporate at a rate that is faster than that of the alkane. In other examples, however, the alkane evaporates at a rate that is faster than that of the aromatic compound of Formula (I). At least 80 percent of the solvent mixture is removed to form the semiconductor layer. For example, at least 85 weight percent, at least 90 weight percent, at least 92 weight percent, at least 95 weight percent, at least 97 weight percent, at least 98 weight percent, at least 99 weight percent, or at least 99.5 weight percent of the solvent mixture is removed.

The solvent mixture often can be evaporated at any suitable temperature. In some methods, the solvent mixture is evaporated at ambient temperature (i.e., at the temperature of the room or facility in which the depositing step is carried out). In other methods, the solvent mixture is evaporated at a temperature higher than ambient temperature. For example, a platen supporting the structure can be heated to a temperature higher than ambient temperature. The solvent can evaporate at a temperature of at least 20° C., at least 30° C., at least 40° C., at least 50° C., at least 60° C., at least 70° C., or at least 80° C. The solvent can evaporate at a temperature of no greater than 100° C., no greater than 90° C., no greater than 80° C., no greater than 70° C., no greater than 60° C., or no greater than 50° C. In still other methods, some or most of the solvent mixture can evaporate at ambient temperature, and any remaining solvents can be evaporated at a temperature higher than ambient temperature. In embodiments wherein the solvent mixture evaporates at a temperature higher than ambient temperature, the evaporation can be carried out under an inert atmosphere, such as a nitrogen atmosphere.

Alternatively, the solvent mixture can be removed by application of reduced pressure (i.e., a pressure that is less than atmospheric pressure) such as through the use of a vacuum. The solvent can be removed at any suitable temperature such as those described for use when the solvent mixture is evaporated.

The rate of removal of the solvent mixture from the deposited layer can affect the resulting semiconductor layer. For example, if the removal process is too rapid, poor packing of the semiconductor molecules tend to occur during crystallization. This poor backing can be detrimental to the electrical performance of the semiconductor layer.

The compositions can be used advantageously for forming semiconductor layers in small, discrete areas on the order of hundreds of microns or for forming semiconductor layers that span large areas. The deposition of the semiconductor layer from a composition containing an organic solvent can be a complex physical process. Many properties of the composition and the surface on which the composition is deposited may influence the performance characteristics of the semiconductor layer that is formed. These include the surface tension of the composition, the interfacial tension between the composition and the surface on which it is deposited, the rate of evaporation of the solvent mixture, the tendency of the contact line between the deposited composition and the surface to pin or recede upon solvent evaporation, the viscosity of the composition, the solubility of the organic semiconductor in the solvent mixture, the degree of supersaturation of the organic semiconductor in the solvent mixture upon evaporation of the various solvents in the solvent mixture, and the crystal habit of the organic semiconductor that forms. Both the absolute surface tensions and evaporation rates of the individual solvents in the solvent mixture and their relation to each other may affect the semiconductor layer. In addition, the change of these properties in the deposited layer as the solvent mixture is removed may affect the performance characteristics of the formed semiconductor layer.

Although not wishing to be bound by theory, the addition of the alkane to the solvent mixture tends to lower the contact angle of the composition on the substrate and may help reduce pinning of the contact line between the composition and the substrate. The alkane typically has a lower surface tension than the aromatic compound of Formula (I). The alkanes often have a surface tension less than 28 dynes/cm, less than 26 dynes/cm, less than 25 dynes/cm, or less than 24 dynes/cm at 20° C. After nucleation of the organic semiconductor at or near the contact line, the lower contact angle and perhaps the reduced pinning may help the organic semiconductor to crystallize and grow along the substrate or on the plane of the substrate rather than up off the plane of the substrate while the solvent evaporates. This is particularly important when charge transport in the organic semiconductor adjacent to the substrate is critical to the performance of the semiconductor device, such as when the composition is deposited onto a gate dielectric in the fabrication of a thin film transistor.

More particularly, when small features are desired (e.g., on the order of 1 mm or less), the aromatic compound of Formula (I) often is selected to have a relatively low vapor pressure such as less than 10 mm mercury, less than 5 mm mercury, or less than 2 mm mercury at 20° C. If the only solvent included in the composition is the aromatic compound of Formula (I), however, the resulting semiconductor layer tends to be non-uniform. Nucleation tends to occur at the perimeter of the deposited layer and crystals of the semiconductor often form predominately at this perimeter. Additionally, if the aromatic compound of Formula (I) has a relatively high surface tension such as greater than 30 dynes/cm, greater than 32 dynes/cm, or greater than 34 dynes/cm at 20° C., crystal growth of the semiconductor material tends to be off the plane of many substrates. Mixing the aromatic compound of Formula (I) with an alkane having 9 to 16 carbon atoms or 10 to 12 carbon atoms tends to result in the formation of crystals over the entire deposited layer and growth along the substrate surface. These alkanes often have a surface tension less than 28 dynes/cm, less than 26 dynes/cm, less than 25 dynes/cm, or less than 24 dynes/cm at 20° C.

Additionally, when small features are desired, the alkane included in the solvent mixture is often selected to have a boiling point that is 5° C. to 35° C. above the boiling point of the aromatic compound of Formula (I). This selection may result in an optimal recirculatory flow (i.e., Marangoni flow) in the composition as the solvent is removed and may lead to the formation of semiconductor layers with optimal electrical performance. The optimum amount of the alkane in the solvent mixture may allow the contact line between the composition and the substrate to be pinned initially for a short time. During this time, nucleation of the semiconductor material occurs. Upon further removal of the solvent mixture, the contact line often recedes inward and the semiconductor crystals grows from the nucleation sites inward. This growth pattern tends to result in a fairly uniform semiconductor layer.

In some methods, the composition is deposited using inkjet printing techniques or another technique that forms a deposit having a minimum lateral dimension no greater than about 2 millimeters. Some exemplary compositions particularly suitable for deposition using inkjet printing techniques include a solvent mixture that contains 1 to 12 weight percent decane and 88 to 99 weight percent anisole, 1 to 10 weight percent decane and 90 to 99 weight percent anisole, or 6 to 12 weight percent decane and 88 to 94 weight percent anisole. Other exemplary compositions particularly suitable for deposition using inkjet printing techniques include a solvent mixture that contains 1 to 12 weight percent dodecane and 88 to 99 weight percent 3,5-dimethylanisole, 1 to 10 weight percent dodecane and 90 to 99 weight percent 3,5-dimethylanisole, 3 to 10 weight percent dodecane and 90 to 97 weight percent 3,5- dimethylanisole, or 3 to 6 weight percent dodecane and 94 to 97 weight percent 3,5-dimethylanisole. Still other exemplary compositions particularly suitable for deposition using inkjet printing techniques include 1 to 12 weight percent undecane and 88 to 99 weight percent n-butylbenzene, 1 to 10 weight percent undecane and 90 to 99 weight percent n-butylbenzene, 3 to 10 weight percent undecane and 90 to 97 weight percent n-butylbenzene, or 4 to 8 weight percent undecane and 92 to 96 weight percent n-butylbenzene.

In other methods, the composition is deposited using a technique such as dip coating or another technique that forms a deposit having a minimum lateral dimension greater than about 2 millimeters. Some exemplary compositions particularly suitable for deposition using dip coating techniques include a solvent mixture that contains 1 to 12 weight percent decane, undecane, dodecane, or a mixture thereof and 88 to 99 weight percent n-butylbenzene, 1 to 10 weight percent decane, undecane, dodecane, or a mixture thereof and 90 to 99 weight percent n-butylbenzene, 4 to 10 weight percent decane, undecane, dodecane, or a mixture thereof and 90 to 96 weight percent n-butylbenzene, or 4 to 8 weight percent decane, undecane, dodecane, or a mixture thereof and 92 to 96 weight percent n-butylbenzene. Other exemplary compositions include a solvent mixture that contains 1 to 12 weight decane and 88 to 99 weight percent anisole, 3 to 12 weight percent decane and 88 to 99 weight percent anisole, 1 to 10 weight percent decane and 90 to 99 weight percent anisole, or 3 to 10 weight percent decane and 90 to 97 weight percent anisole, or 6 to 10 weight percent decane and 90 to 94 weight percent anisole.

The relatively low temperatures used to deposit the composition to form the deposited layer and for removal of the solvent mixture from the deposited layer to form the semiconductor layer permits the use of a variety of substrates, conducting materials, and dielectric materials. That is, any of these other layers can be formed of materials that are typically considered sensitive to heat. For example, For example, the substrates or any of the other layers can be flexible, polymeric materials.

Transistors having any desired architecture (with respect to the location of, for example, the semiconductor layer, the contacts (source and drain electrodes), and the gate electrode) can be prepared. In some embodiments, the transistor includes a bottom gate, bottom contact architecture.

The properties of the resulting transistors such as, for example, the saturation field effect mobility GO, can be varied by varying the composition. The saturation field effect mobility can be determined by, for example, measuring the drain-source current ($I_{DS}$) as a function of gate-source voltage bias ($V_{GS}$) from +10V to −40V at a constant drain-source voltage bias ($V_{DS}$) of −40V. The saturation field effect mobility ($\mu$) can be calculated from the slope of the plot of the square root of $I_{DS}$ against $V_{GS}$ using the equation $$I_{DS}=\mu WC(V_{GS}-V_t)^2 \div 2 L$$

where C is the specific capacitance of the gate dielectric, W is the channel width, L is the channel length, and $V_t$ is the threshold voltage, as described in the Examples. The units of W, the channel width, and L, the channel length are often the same (e.g., micrometers).

The field effect mobility ($\mu$) can be at least $1\times10^{-5}$ cm$^2$/V-s, at least $5\times10^{-5}$ cm$^2$/V-s, at least $1\times10^{-4}$ cm$^2$/V-s, at least $5\times10^{-4}$ cm$^2$/V-s, at least $1\times10^{-3}$ cm$^2$/V-s, at least $5\times10^{-3}$ cm$^2$/V-s, at least $1\times10^{-2}$ cm$^2$/V-s, at least $5\times10^{-2}$ cm$^2$/V-s, at least $1\times10^{-1}$ cm$^2$/V-s, or at least $5\times10^{-1}$ cm$^2$/V-s. In some embodiments, the field effect mobility ($\mu$) of the resulting transistor has a field effect mobility that is higher than other transistor devices prepared by forming the semiconductor layer from a composition having a different solvent or a different solvent mixture. The crystal morphology in the resulting semiconductor layer formed from the compositions described herein is often more favorable in terms of improving the field effect mobility compared to previously known compositions.

EXAMPLES

Unless otherwise noted, all reagents and solvents were or can be obtained from Sigma Aldrich Co., St. Louis, Mo.

Unless otherwise noted, percentages of components of compositions are weight percentages.

The term "DMA" refers to 3,5-dimethylanisole.

The term "nbb" refers to n-butylbenzene.

The term "PS" refers to atactic poly(styrene) having a number average molecular weight of 112,000 grams/mole and a polydispersity index of 1.05. This poly(styrene) was obtained from Polymer Source, Inc. (Dorval, Quebec, Canada).

The term "PS2" refers to a second poly(styrene) having a number average molecular weight of 50,000 and a polydispersity index of 1.06. This poly(styrene) was obtained from Alfa Aesar, Ward Hill, Mass.

The term "TIPS" refers to 6,13-bis(triisopropylsilylethynyl)pentacene, prepared essentially as described in U.S. Pat. No. 6,690,029 (Anthony et al.).

The term "A-DIPS" refers to 6,13-bis(allyldiisopropylsilylethynyl)pentacene. This compound was prepared as described below.

The term "IP-DIPS" refers to 6,13-bis(diisopropyl-2-propenylsilylethynyl)pentacene. This compound was prepared as described below.

The term "C-DIPS" refers to 6,13-bis(cyclopropyldiisopropylsilylethynyl)pentacene. This compound was prepared as described below.

The term "B-DIPS" refers to 6,13-bis(2-but-1-enyldiisopropylsilylethynyl)pentacene. This compound was prepared as described below.

The term "THF" refers to tetrahydrofuran.

The term "MeOH" refers to methanol.

The term "DCM" refers to dichloromethane.

The term "polymerizable ZrOAc" refers to a composition that contained surface modified zirconia nanoparticles dispersed in a polymerizable composition and solvent. The preparation of the polymerizable ZrOAc composition is described below.

The term "cured ZrOAc" refers to a composite resulting from the drying and polymerization (i.e., curing) of the polymerizable ZrOAc composition.

The term "CE" refers to Comparative Example.

Preparation of Polymerizable ZrOAc Composition

Zirconia nanoparticles were prepared using hydrothermal technology as described in U.S. Pat. No. 7,241,437 (Davidson et al.). More specifically, a first feedstock that contained a zirconium salt was subjected to a first hydrothermal treatment to form a zirconium-containing intermediate and a byproduct. A second feedstock was prepared by removal of at least some of the acidic byproduct formed during the first hydrothermal treatment. The second feedstock was then subjected to a second hydrothermal treatment to form a zirconia sol that contained the zirconia nanoparticles. The dimensions of the nanoparticles were determined by transmission electron microscopy. The nanoparticles ranged in size from approximately 1.8 to 11.2 nanometers (nm) with an average particle size of approximately 4.7 nm with a standard deviation of 1.3 nm. The aspect ratios of the nanoparticles ranged from approximately 1 to 3.4.

The zirconia nanoparticles of the zirconia sol were then surface modified with 3-(methacryloxypropyl)trimethoxysilane by a process similar to that described in Example 2 of U.S. Pat. No. 7,264,872 (Walker, Jr. et al.) except that only one silane was used. The silane, which was 3-methacryloxypropyl)trimethoxysilane, is commercially available under the trade designation SILQUEST A-174 from GE-Silicones (Wilton, Conn.). The process resulted in a surface modified zirconia nanoparticles dispersion.

The surface modified zirconia nanoparticle dispersion was combined with tris(2-hydroxyethyl)isocyanurate triacrylate (available under the trade designation SR-368 from Sartomer Co. Inc., Exton, Pa.) and 1-hydroxycyclohexylphenyl ketone (a photoinitiator available under the trade designation IRGACURE 184 from Ciba, Tarrytown, N.Y.), and a solvent 3,5,5-trimethyl-2-cyclohexen-1-one (also named isophorone and available from Alpha Aesar, Ward Hill, Mass.). The combined materials were mixed via magnetic stirring. The mixture was subjected to rotary evaporation using a bath temperature of 65° C. and vacuum (6 mm Hg, 800 Pa) to ensure preferential removal of the water, methylethylketone, and 1-methoxypropan-2-ol. The resulting mixture contained approximately 8.5 weight percent of tris(2-hydroxyethyl)isocyanurate triacrylate (SR-368), 40.0 weight percent of the surface modified zirconia nanoparticles, 1.5 weight percent of 1-hydroxycyclohexylphenyl ketone (Irgacure 184), and 50.0 weight percent of 3,5,5-trimethyl-2-cyclohexen-1-one. The resulting mixture contained 50 weight percent solids and 40 weight percent of surface modified zirconia nanoparticles. The mixture was cooled to room temperature and then filtered through a 1.0 micrometer filter into a clean amber glass bottle.

Preparation of A-DIPS

Dichlorodiisopropylsilane (4.00 grams, 21.6 mmol) and anhydrous THF (20 mL) were added into a dry 250-mL round bottom flask equipped with a stir bar. The flask was equipped with a dry condenser. Allyl magnesium bromide (22.0 mL, 22.0 mmol, 1.0 M in THF) was added to the flask through the condenser to form a first mixture. The first mixture was heated to 63° C. for 12 hours, and then cooled to room temperature.

Trimethylsilyl acetylene (2.36 grams, 24.0 mmol) and anhydrous THF (12 mL) were added to a separate dry 100-mL round bottom flask equipped with a stir bar. The 100-mL flask reaction mixture was cooled to 0° C., and then n-butyllithium (9.2 mL, 23 mmol, 2.5 M in hexane) was added dropwise. This was followed by stirring for 90 minutes to form a second mixture.

The 250-mL flask containing the reaction mixture (i.e., the first mixture) was then cooled to 0° C., and the second mixture was added dropwise via syringe. The combined mixture was allowed to stir overnight. The combined mixture was then poured into 100 mL saturated $NH_4Cl$ solution, and rinsed with a 1:1 hexane and diethyl ether mixture (100 mL). The organic layer was separated, and the water layer was extracted again with 50 mL of 1:1 hexane and diethyl ether mixture (100 mL). The organic portions were combined, washed with water (50 mL) and brine (25 mL), dried over magnesium sulfate, filtered, and concentrated via rotary evaporation.

The product was taken up in THF (50 mL). Methanol saturated with $K_2CO_3$ (100 mL) was added, followed by stirring for 2 hours. Water (50 mL) and hexane (100 mL) were added, and the organic layer was separated. The water layer was extracted again (20 mL hexane) and the organic layers were combined. The combined organic layers were washed with water (20 mL), dried over magnesium sulfate, filtered, and subjected to solvent evaporation. The product was purified by column chromatography (5:1 hexane and DCM), yielding 1.7 grams of a colorless oil (9.4 mmol, 44 percent yield). Analysis of the product provided the following data: $^1$H-NMR (200 MHz, $CDCl_3$) δ=5.87 (m, 1H), 4.94 (m, 2H), 2.39 (s, 1H), 1.70 (dt, J=1.4 Hz, 8 Hz, 2H), 1.08 (s, 14H). This is consistent with the formation of allyldiisopropylsilyl acetylene.

The above allyldiisopropylsilyl acetylene (1.62 grams, 9.36 mmol) and anhydrous THF (20 mL) were added to a dry 100-mL round bottom flask with a stir bar and cooled to 0° C. An aliquot of n-butyllithium (3.1 mL, 7.8 mmol, 2.5 M in hexane) was added dropwise and the solution was allowed to warm over 1 hour. Then, 6,13-pentacenequinone (1.22 grams, 3.89 mmol) was added and the mixture was stirred for 48 hours. The reaction was quenched by the addition of 0.5 mL of saturated $NH_4Cl$ solution and then diluted with MeOH (60 mL) to form a reaction mixture.

In a large Erlenmeyer flask, MeOH (600 mL), $SnCl_2.2H_2O$ (2.60 grams, 11.5 mmol), and 25% HCl (2.5 mL) were combined with stirring and cooled to 0° C. to form a second solution. The reaction mixture was added in a slow stream to the second solution and rinsed in with additional MeOH. Additional 25% HCl (3 mL) was added, and the mixture was stirred for 20 minutes. The mixture was placed in the refrigerator for 1 hour and then filtered to yield 1.3 grams of a greenish-blue solid. The resulting solid was dissolved in minimal DCM (about 5 mL), diluted with hexane (200 mL), and rinsed onto a thick silica plug. Excess acetylene was removed by flushing the plug with hexane. The product was eluted using a 5:1 mixture of hexanes and DCM. The solvent was removed to yield 0.5 grams of blue solid. The solid was dissolved in hot acetone, filtered while hot to remove a green impurity, and allowed to crystallize overnight. A second recrystallization from acetone yielded 0.38 grams of blue needles (0.62 mmol, 16 percent yield). Analysis of the blue needles product provided the following data: $^1$H-NMR (200 MHz, $CDCl_3$) δ=9.3 (s, 4H), 8.0 (dd, J=3.4 Hz, 4H), 7.4 (dd, J=3.4 Hz, 4H), 6.38 (m, 2H), 5.1 (m, 4H), 2.0 (m, 4H), 1.3-1.4 (m, 28H).

Preparation of IP-DIPS 2-Bromopropene (4.32 grams, 38.6 mmol) and anhydrous THF (20 mL) were combined in a dry 250-mL round-bottom flask with a stir bar, and then cooled to −78° C. An aliquot of n-butyllithium (14.8 mL, 37 mmol, 2.5 M in hexanes) was added dropwise. Stirring was continued and the temperature was maintained for 10 minutes, followed by the dropwise addition of dichlorodiisopropylsilane (6.85 grams, 37.0 mmol). The mixture was allowed to warm and stirred for 48 hours to form a first mixture.

In a separate dry 100-mL round-bottom flask with a stir bar, trimethylsilylacetylene (3.93 grams, 40.0 mmol) and anhydrous THF (10 mL) were combined and cooled to 0° C. An aliquot of n-butyllithium (14.8 mL, 37 mmol, 2.5 M in hexane) was added dropwise and stirring was continued for 2 hours to form a second mixture.

The first reaction mixture was cooled to 0° C. The second mixture was added to the first mixture by syringe, and stirring was continued for 12 hours. The reaction flask was emptied into a saturated $NH_4Cl$ solution (100 mL), and then a 1:1 hexane and diethyl ether mixture (100 mL) was added. The organic layer was separated, and the water layer was extracted again with the 1:1 hexane and diethyl ether mixture (20 mL). The organic portions were combined, washed with water (20 mL) and brine (20 mL), dried over magnesium sulfate, filtered, and concentrated via rotary evaporation. The product mixture was dissolved in THF (50 mL) and then MeOH saturated with $K_2CO_3$ was added. Stirring was continued for 2 hours. Water (100 mL) and hexane (100 mL) were added. The organic layer was separated and then washed with water (20 mL), dried over magnesium sulfate, filtered, and concentrated via rotary evaporation to yield 4.6 grams of a colorless oil (26 mmol, 70 percent yield). Analysis of the colorless oil product provided the following data: $^1$H-NMR (200 MHz, CDCl$_3$) δ=5.76 (m, 1H), 5.51 (m, 1H), 2.42 (s, 1H), 1.88 (s, 3H), 1.05 (m, 14H). This is consistent with the formation of isopropenyldiisopropylsilyl acetylene.

The above isopropenyldiisopropylsilyl acetylene (3.00 grams, 16.7 mmol) and anhydrous THF (16 mL) were combined in a dry 100-mL round bottom flask with a stir bar. After cooling the flask to 0° C., n-butyllithium (5.6 mL, 14 mmol, 2.5 M in hexane) was added dropwise. Stirring was continued for 2 hours. 6,13-Pentacenequinone (1.4 grams, 4.6 mmol) was added and the mixture was stirred for 48 hour. The reaction was quenched by the addition of 0.5 mL of saturated NH$_4$Cl solution, and then diluted with MeOH (50 mL) to form a first reaction mixture.

In a large Erlenmeyer, SnCl$_2$.2H$_2$O (5.8 grams, 25 mmol) was dissolved in MeOH (800 mL) and 25% HCl (5 mL) was added to form a second mixture. After cooling the second mixture to 0° C., the first reaction mixture was added in a slow stream and allowed to stir for 20 minutes. The resulting mixture was placed in the refrigerator for 1 hour and then filtered to yield a blue-green solid. The blue-green solid was taken up in minimal amount of DCM (about 5 mL), diluted with hexane (200 mL), and then rinsed onto a thick silica plug. Excess acetylene was flushed using hexane, and then the product was eluted using a 5:1 hexane and DCM mixture. Removal of solvent yielded 1.35 of a blue solid. Recrystallization from acetone (about 400 mL) yielded 1.1 grams of blue needles (1.74 mmol, 38 percent yield). Analysis of the blue needles product provided the following data: $^1$H-NMR (200 MHz, CDCl$_3$) δ=9.3 (s, 4H), 8.0 (dd, J=3.2 Hz, 4H), 7.4 (dd, J=3.2 Hz, 4H), 5.9 (bm, 2H), 5.8 (bm, 2H), 2.1 (s, 6H), 1.3-1.4 (m, 28H); and mass spectroscopy (70 eV, EI) m/z 634 (100%, M+).

Preparation of C-DIPS

This material was synthesized using methods similar to those used to prepare allyldiisopropylsilyl acetylene discussed above in the preparation of A-DIPS by substituting cyclopropyl magnesium bromide for allyl magnesium bromide. $^1$H-NMR (200 MHz, CDCl$_3$) δ=2.3 (s, 1H), 1.1 (br-m, 14H), 0.61 (m, 2H), 0.45 (m, 2H), −0.44 (m, 1H).

The preparation continued similarly to that for the preparation of A-DIPS by substituting cyclopropyldiisopropylsilyl acetylene for allyldiisopropylsilyl acetylene. $^1$H-NMR (200 MHz, CDCl$_3$) δ=9.2 (s, 4H), 8.0 (dd, J=3.2, 5.6 Hz, 4H), 7.4 (dd, J=3.2, 5.6 Hz, 4H), 1.4 (br-m, 28H), 0.85 (m, 8H), -0.21 (m, 2H).

Preparation of B-DIPS

This compound was synthesized by methods similar to those used to prepare isopropenyldiisopropylsilyl acetylene discussed above in the preparation of IP-DIPS by substituting 2-lithio-1-butene (generated in situ by treating 2-bromo-1-butene with n-BuLi in tetrahydrofuran at −78° C.) for 2-lithio-propene (generated in situ by treating 2-bromopropene with n-BuLi in tetrahydrofuran at −78° C.). $^1$H-NMR (200 MHz, CDCl$_3$) δ=5.76 (q, J=1.2 Hz, 1H), 5.55 (quint, J=1.2 Hz, 1H), 2.41 (s, 1H), 1.06 (br. s, 14H), 2.19 (q,t, J=9.5, 1.2 Hz, 2H), 1.10 (t, J=9 Hz, 3H).

The preparation continued similarly to that for the preparation of IP-DIPS by substituting (1-methylenepropyl)diisopropylsilyl acetylene for isopropenyldiisopropylsilyl acetylene. $^1$H-NMR (200 MHz, CDCl$_3$) δ=9.33 (s, 4H), 7.98 (dd, J=3.4, 6.6 Hz, 4H), 7.41 (dd, J=3.4, 6.6 Hz, 4H), 5.9 (q, J=1 Hz, 2H), 5.83 (quint, J=1 Hz, 2H), 2.19 (q,t, J=8, 1.1 Hz, 4H), 1.39 (br. s, 28H), 1.24 (t, J=8 Hz, 6H).

Preparation of Compositions with a Solvent and an Organic Semiconductor—Composition Preparation Method I An amount of an organic semiconductor and an optional amount of polystyrene were weighed into a glass vial followed by the weighed addition of solvent(s) to prepare a composition of the desired concentrations of organic semiconductor and optional polystyrene in the composition and the desired weight ratio of solvents for compositions that contained more than one solvent. The vial was capped, and then wrapped with aluminum foil to shield the composition from light. The vial was placed on a IKA LABORTECHNIK HS501 shaker (IKA Werke GmbH & Co. KG, Staufen, Germany) and shaken for a minimum of 12 hours.

Preparation of Compositions with a Solvent and an Organic Semiconductor—Composition Preparation Method II An amount of an organic semiconductor and an optional amount of polystyrene were weighed into a glass vial containing a magnetic stir bar followed by the weighed addition of solvent(s) to prepare a composition of the desired concentrations of organic semiconductor and optional polystyrene in the composition and the desired weight ratio of solvents for composition that contained more than one solvent. The vial was capped, and then placed on a stir plate and the contents stirred. The vial was covered with a metal can to shield the composition from light. The contents were stirred for a minimum of 12 hours.

Preparation of Layered Transistor Structures

Unless otherwise noted transistors having a bottom gate, bottom contact architecture were prepared. Such architecture is described in, for example, U.S. Patent Application Publication No. 2007/0158643 (Vogel et al.). Each transistor was prepared using one of eight substrates. Source and drain electrodes were rectangular and ran parallel to each other separated by the channel length. The transistors had a channel length, L, of 100 micrometers unless otherwise noted.

Substrate A was glass with dimensions of approximately 50 millimeters by approximately 50 millimeters by approximately 0.7 millimeters and having a layer of sputtered aluminum approximately 200nm thick on one side. The top surface of the aluminum was anodized to alumina (Al$_2$O$_3$) of the desired thickness, typically around 100 nm (75 V). A layer (approximately 300 nanometers to approximately 400 nanometers thick) of dried and cured ZrOAc was formed on the anodized surface. The dried and cured ZrOAc layer was formed by coating the anodized alumina surface with a ZrOAc polymerizable composition by spin coating (acceleration rate of 415 revolutions per minute (RPM) with a final speed of 2000 RPM for 30 seconds), heating on a hot plate at 100° C. for 10 minute, and exposing to UV light (i.e., 254 nm germicidal lamp) in a nitrogen atmosphere for 15 minutes, and then heating on a hot plate at 100° C. for 10 minutes. Gold source and gold drain electrodes were vapor-deposited (approximately 2000 Angstroms thick) on the dried and cured ZrOAc layer. Patterning of these electrodes was carried out using a shadow mask.

Substrate B was an n-type silicon wafer with thermal oxide (a silicon <100> wafer highly doped n+(arsenic) with a resistivity less than 0.005 ohm-cm, and supplied with a 1000 Angstrom-thick thermal oxide (SiO$_2$) on the front surface and coated with 100 Angstroms of titanium nitride and 5000 Angstroms of aluminum on the back surface), from Noel Technologies, Inc. (Campbell, Calif.). The wafer was cleaned using an oxygen plasma. The gold source and gold drain electrodes were vapor-deposited onto the oxide layer to a thickness of approximately 2000 Angstroms. Patterning was carried out using a shadow mask. Substrate B was cleaned using an oxygen plasma immediately prior to use.

Substrate C was an n-type silicon wafer with thermal oxide (a silicon <100> wafer highly doped n+ (arsenic) with a resistivity of less than 0.005 ohm-cm, and supplied with a 1000 Angstrom-thick thermal oxide ($SiO_2$) on the front surface and coated with 100 Angstroms of titanium nitride and 5000 Angstroms of aluminum on the back surface), from Noel Technologies, Inc. (Campbell, Calif.). The wafer was cleaned using an oxygen plasma. The gold source and gold drain electrodes were vapor-deposited onto the oxide layer. Patterning was carried out using a shadow mask. The substrate was cleaned using an oxygen plasma, and was then immersed in a 10 millimolar toluene solution of pentafluorothiophenol (obtained from Alfa Aesar, Ward Hill, Mass.) for one minute. The substrate was then dipped in and rinsed with toluene and was dried on a hot plate having a surface temperature of approximately 110° C. for approximately 6 minutes. The substrate was allowed to cool for approximately 25 minutes, and then 1,1,1,3,3,3-hexamethyldisilazane was applied to the surface and was allowed to stand for approximately two minutes before using a spin coater at 4000 RPM for approximately 2 minutes. The substrate was stored in a wafer carrier overnight before use.

Substrate D was an n-type silicon wafer with thermal oxide (a silicon <100> wafer highly doped n+(arsenic) with a resistivity of less than 0.005 ohm-cm, and supplied with a 1000 Angstrom-thick thermal oxide ($SiO_2$) on the front surface and coated with 100 Angstroms of titanium nitride and 5000 Angstroms of aluminum on the back surface), from Noel Technologies, Inc. (Campbell, Calif.). The wafer was cleaned using an oxygen plasma. The gold source and gold drain electrodes were vapor-deposited onto the oxide layer. Patterning was carried out using a shadow mask. The substrate was cleaned using an oxygen plasma, and was then immersed in a 10 millimolar toluene solution of pentafluorothiophenol (obtained from Alfa Aesar, Ward Hill, Mass.) for one minute. The substrate was then dipped into and rinsed with toluene and was dried on a hot plate having a surface temperature of approximately 110° C. for approximately 6 minutes. The substrate was allowed to cool for approximately 40 minutes before use.

Substrate E was an n-type silicon wafer with thermal oxide (a silicon <100> wafer highly doped n+(arsenic) with a resistivity of less than 0.005 ohm-cm, and supplied with a 1000 Angstrom thermal oxide ($SiO_2$) on the front surface and coated with 100 Angstrom titanium nitride and 5000 Angstrom aluminum on the back surface) from Noel Technologies, Inc. (Campbell, Calif.). The wafer was cleaned using an oxygen plasma. A thin layer of titanium and an approximately 2000-Angstrom thick layer of gold were vapor-deposited onto the thermal oxide to form the source and drain electrodes. Patterning was carried out using conventional photolithographic lift-off methods. The substrate was cleaned using an oxygen plasma, and was then immersed in a 10 millimolar toluene solution of pentafluorothiophenol for one minute. The substrate was then dipped into and rinsed with toluene and was dried on a hot plate having a surface temperature of approximately 110° C. for approximately 6 minutes. The substrate was allowed to cool for approximately 25 minutes, and then 1,1,1,3,3,3-hexamethyldisilazane was applied to the surface, allowed to stand for approximately 2 minutes before using a spin coater at 4000 rpm for approximately 2 minutes. Then the wafer was allowed to stand in a wafer carrier for at least 8 hours before use.

Substrate F was glass, having dimensions of approximately 50 millimeters by approximately 50 millimeters by approximately 0.7 millimeters and having a layer of sputtered aluminum approximately 200 nm on one side. The top surface of the aluminum was anodized to $Al_2O_3$ of the desired thickness, typically around 100 nm (75 V), and had a layer (approximately 300 nanometers to approximately 400 nanometers thick) of dried and cured ZrOAc on the anodized surface. The cured ZrOAc was formed by coating the anodized aluminum with a polymerizable ZrOAc composition by spin coating (acceleration rate of 415 RPM/s, final speed of 2000 RPM for 30 seconds), heating on a hot plate at 100° C. for 10 minute, exposing to UV light (i.e., 254 nm germicidal lamp) in a nitrogen atmosphere for 15 minutes, and then heating on a hot plate at 100° C. for 10 minutes. Silver source and drain electrodes were vapor-deposited (approximately 2000 Angstroms thick) on the dried and cured ZrOAc layer. Patterning was carried out using conventional photolithographic lift-off methods.

Substrate G was an n-type silicon wafer with thermal oxide (a silicon <100> wafer highly doped n+(arsenic) with a resistivity of <0.005 ohm-cm, and supplied with a 1000 Angstrom thermal oxide ($SiO_2$) on the front surface and coated with 100 Angstrom TiN and 5000 Angstrom aluminum on the back surface) from Noel Technologies, Inc. (Campbell, Calif.). The wafer was cleaned using an oxygen plasma immediately prior to use.

Substrate H was glass with dimensions of approximately 50 millimeters by approximately 50 millimeters by approximately 0.7 millimeters and having a thin layer (approximately 300 nanometers to approximately 400 nanometers thick) of dried and cured ZrOAc dielectric on one surface. The glass was coated with a polymerizable ZrOAc composition by spin coating (acceleration rate of 415 RPM/s, final speed of 2000 RPM for 30 seconds), was then heated on a hot plate at 100° C. for 10 minute, was then exposed to UV light (i.e., 254 nm germicidal lamp) in a nitrogen atmosphere for 15 minutes, and was then heated on a hot plate at 100° C. for 10 minutes.

Substrate I was a flexible poly(ethylene naphthalate) or PEN film, which is commercially available from DuPont (Wilmington, Del.) under the trade designation TEONEX Q65FA, that contained an array of layered transistor structures that were fabricated by inkjet printing of the gate electrode layer, gate dielectric layer, and source and drain electrode layer on the film. The array contained 8 rows and 15 columns of transistor structures (120 transistor structures total), and the transistor structures were on a 3.0 mm pitch. All of the images of the layers that were printed (gate electrode, gate dielectric, source and drain layers) were created in Adobe Photoshop. The all-inkjet printed layered transistor structures were fabricated by the process described in detail below.

An 8"×11.5" piece of 8 mil thick PEN film was fastened between two pieces of stainless steel. The two pieces of stainless steel were clamped around the perimeter of the PEN film such that the stainless steel clamps framed the PEN film. This stainless steel frame helps minimize the shrinkage in the PEN film throughout the process. Both sides of the framed PEN film were cleaned numerous times with absolute ethanol in order to reduce particle contamination and to provide a clean surface with a more consistent surface energy. After cleaning, the clamped film was positioned on top of a hot plate and the frame sat on an aluminum vacuum table of the inkjet deposition system. The hot plate was attached to the aluminum vacuum table and fit inside the frame. The frame was fastened with four screws into the aluminum vacuum table. After the clamped film was placed in the system, the top surface was cleaned one more time with ethanol.

A printhead, which is commercially available under the trade designation SX3-128 from Fujifilm Dimatix, Inc. (Santa Clara, Calif.), was then inserted into the system. The deposition system had precise position control of the inkjet printhead in the x–y directions. This printhead had 128 jets with a 10 pL drop volume. The printhead was filled with approximately 20.0 mL of inkjetable silver conductor ink, which is commercially available under the trade designation CABOT AG-IJ-G-100-S1 from Cabot Corporation (Alburquerque, N. Mex.). This material served as the gate layer of the backplane. Once the printhead was in the system, the height and sabre angle were adjusted. The printhead height was adjusted to approximately 1.0 mm above the surface of the PEN film. The sabre angle was adjusted to give a desired resolution of 702 drops per inch (dpi). Upon completion of the aforementioned, the substrate was registered. The corner of the stainless steel frame was used as the starting point or origin. From the origin a 1.0 inch offset was set in the negative x and y direction. This was the location where the printhead started printing the conductive ink or patterned gate layer. Registration was accomplished with a DVT Machine Vision (Legend 530) CCD camera.

Before the application of the conductive ink, the substrate was pre-shrunk. Shrinking of the film between the thermal curing of each layer affects registration of subsequent layers. The pre-shrinking process included heating the film from the bottom and the top of the substrate. Heating from below was done with the online hot plate. The hot plate was set to 125° C. Heating from above the substrate was done with a 500 Watt/inch infrared (IR) lamp. Once the hot plate reached 125° C., the IR lamp scanned over the substrate 5 times with a velocity of 2 inches per second and at a 100 percent power level. This process took 25 seconds and the maximum temperature of the substrate reached 140° C., which was recorded by an infrared pyrometer.

Upon completion of the pre-shrinking process, the substrate/platen was cooled to a temperature of 45° C. and the silver conductor ink was inkjet printed onto the PEN film. Once the patterned silver conductor ink was deposited onto the substrate, it was held at 45° C. for 5.0 minutes and then sintered with the online hot plate and infrared lamp. The hot plate was set to 125° C. and the IR lamp scanned over the patterned image 5 times at a velocity of 2.0 inches per second and at 100 percent power. It took approximately 25 seconds to sinter the silver with the IR lamp. After the silver was sintered, the temperature of the hot plate was set to 150° C. The substrate remained at this temperature for 10 minutes.

The next layer in the fabrication of the all-inkjet printed backplane was the gate dielectric layer. After thermally curing the gate layer, the SX3-128 printhead was removed and replaced with a printhead that is commercially available under the trade designation SE-128 from Fujifilm Dimatix, Inc. (Santa Clara, Calif.). This printhead was used for printing the dielectric material composition, which was a ZrOAc polymerizable compostiion. The SE-128 printhead had 128 jets and a 30 picoliter (pL) drop volume. The height was set to approximately 1.0 mm above the substrate and the sabre angle was set to produce a resolution of 702 dpi. The platen temperature was reduced to 26° C. Before printing the dielectric layer, a test print was printed for registering the dielectric layer relative to the patterned gate layer. The test print was compared to another test print that was printed with the gate layer. The measured difference between the two test prints determined where printing of the dielectric layer began. The registration of this layer was done with the use of the CCD camera.

Once registration was completed, a blanket coat of dielectric material was printed onto the gate layer. Upon completion of printing, the printed material was immediately dried, cured, and dried again. The first drying process or pre-bake was done with the online hot plate and IR lamp. Once the hot plate reached a temperature of 75° C., the IR lamp scanned over the printed image two times at a velocity of 2.0 in/sec and at 40 percent power. The IR step in this process was low temperature. Increasing the intensity of this step could cause the dielectric layer to "skin over" and trap the solvent. Therefore, most of the drying was done thermally from below the substrate. After the infrared lamp scanned over the sample, the platen temperature remained at 75° C. for an additional 10 minutes. This step in the process was utilized to remove any remaining solvent. After the solvent was removed, the dried material was cured or cross-linked at a platen temperature of 45° C. This was accomplished with a 250 nm wavelength UV germicidal lamp with a nitrogen purge. This process took 401 seconds to complete. The final drying step or post-bake used the same process steps as the previously mentioned pre-bake except that the IR lamp was scanned over the image 5 times at 2.0 in./sec and at 100 percent power.

Upon completion of the dielectric layer, the SE-128 printhead was removed from the system and replaced with the SX3-128 printhead for deposition of the source and drain layer. The source and drain layer was printed twice with inkjetable silver conductor ink commercially available from Cabot under the trade designation CABOT AG-IJ-G-100-S1 from Cabot Corporation (Alburquerque, N. Mex.). The height of the printhead was adjusted to approximately 1.0 mm above the substrate and the sabre angle was set for a resolution of 702 dpi.

For printing of the first source and drain layer, the platen was cooled to 45° C. and registration was done in the same manner as previously mentioned for the dielectric layer. Once printing was complete, the platen temperature was raised to 60° C. for 30 seconds. This sintered the silver along the edges before completely sintering the material at a higher temperature. After 30 seconds, the platen temperature was raised to 150° C. for 10 minute.

For the second printed source and drain layer, not every image or feature was printed twice. The drain lines were only printed once, whereas the source pads were printed twice. The source pads were printed twice due to non-uniformity after the sintering of the first layer. The platen was set to 150° C. for 10 minutes to sinter the silver. The channel length, that is the distance between the source pad and drain line, was 150 μm.

Before the process of printing the semiconductor began, the platen was cooled to 30° C. and a surface treatment was applied to the dielectric material and the source/drain contacts. High purity toluene was deposited onto the surface of the entire sample with a pipet and left on the sample for 1.0 minute. After 1.0 minute, the toluene was removed by blowing it off with an air can (Uline, S-6771). Next, a solution of 1.0 mmol perfluorothiophenol in high purity toluene was deposited on the surface of the entire sample and left for 1.0 minute. The solution was removed by blowing it off with an air can. The surface was again treated with the perfluorothiophenol solution for 1.0 minute. The solution was removed by blowing it off with the air can. For the final step, high purity toluene was deposited on the entire surface of the substrate for 20 seconds. After 20 seconds the toluene was blown off the sample with an air can.

Preparation of Transistors by Inkjet Printing—Semiconductor Deposition Method I

Compositions were deposited onto the layered transistor structures using an inkjet printer (commercially available under the trade designation DIMATIX 2800 series, available from Fujifilm Dimatix, Inc., Santa Clara, Calif.) in one of three print patterns, each with an individual drop volume of 10 picoliters. The compositions were passed through a 0.2 micrometer filter as they were loaded into inkjet cartridges (Model No. DMCLCP-11610, from Fujifilm Dimatix, Inc., Santa Clara, Calif.). The inkjet head and the platen on which the layered transistor structures were placed were held at a temperature of approximately 30° C. The distance from the inkjet head to the substrate was approximately 1 millimeter. For Print Pattern 1, 52 drops of a composition were deposited in a 13×4 drop matrix (the center-to-center spacing of the drops was 40 micrometers) onto each transistor. For Print Pattern 2, 99 drops of a composition were deposited in an 11×9 drop matrix (the center-to-center spacing of the drops was 40 micrometers) onto each transistor. For Print Pattern 3, 121 drops of a composition were deposited in an 11×11 drop matrix (the center-to-center spacing of the drops was 30 micrometers) onto each transistor. These various X×Y drop matrices were deposited such that the X drops ran in the same sense (e.g., direction) as the channel width and the Y drops ran in the same sense as the channel length. Each composition was allowed to dry at 30° C. while on the platen during printing of the substrate, and then at room temperature after printing was completed. The mobility was determined approximately 1 hour to 24 hours after the compositions were deposited.

Preparation of Transistors by Inkjet Printing—Semiconductor Deposition Method II Compositions were deposited onto Substrate I, a PEN film containing layered transistor structures formed by an all-inkjet process, by the following method. Upon completion of the surface treatment of Substrate I as described in "Preparation of Layered Transistor Structures", the SX3-128 printhead was removed from the system and replaced with the SE-128 printhead. This printhead was filled with a semiconductor composition for forming the semiconductor layer. The SE-128 printhead has 128 jets and an individual drop volume of 30 picoliters (pL). The height was set to approximately 1.0 mm above the substrate and the sabre angle was set to produce a resolution of 702 dpi. Registration of the semiconductor layer was completed as previously mentioned for the other layers of Substrate I.

Before deposition of the semiconductor composition, a preheat step was performed in order to remove any solvent (toluene) that remained on the substrate after the surface treatment. This preheat step was completed with the online infrared lamp at 6 passes, 2.0 in/sec, and 80 percent power. Once completed, the platen was cooled to 30° C.

The semiconductor composition was deposited onto Substrate I in a print pattern defined by a bitmap image created in Adobe Photoshop and shown in FIG. 1. Each bit or pixel in the bitmap image represents approximately a 36 micrometers×36 micrometers area as established by the 702 dpi resolution. The dark bits in FIG. 1 indicate deposition of 1 drop (30 pL) of the semiconductor composition. The light bits indicate that no semiconductor deposition occurred at that location. A total of 44 drops of the semiconductor composition was deposited onto each transistor structure. The centerline of the print pattern, which runs the length of the long dimension of the pattern as defined by the bitmap, was centered over the center of the thin film transistor channel with the centerline running in the same direction as the channel width. That is, the centerline of the print pattern was positioned midway between the source and drain electrodes.

Preparation of Transistors by Dip-Coating—Semiconductor Deposition Method III

All dip-coating experiments used Substrate G, which were treated for 3 minutes in a Plasma Cleaning System (Model YES-G1000 from Yield Engineering Systems, Inc., Livermore, Calif.) using a power setting of 500 Watts and oxygen pressure of approximately 200 milli-Torr. Each semiconductor solution was filtered through a polytetrafluoroethylene (PTFE) filter with a pore size of 0.2 micron and 25 mm diameter that is commercially available under the trade designation ACRODISC CR from Pall Life Sciences (East Hills, N.Y.) and then placed in a dip-coating tank (approximately 50 mm wide, 5 mm deep, and 30 mm high). Each substrate sample was dipped at a draw rate of approximately 3 millimeters per minute using a dip coating apparatus that is commercially available under the trade designation NIMA D1L from Nima Technology Ltd. (Coventry, United Kingdom). Approximately 5 mL of each solution was used. Each sample was allowed to dry at room temperature. After coating, long crystals were present on the $SiO_2$ surface of the substrate, and typically oriented parallel to the dip axis. That is, the long dimension of the crystals ran in the same direction as the dip direction. Gold source and drain electrodes (approximately 800-1000 Angstroms thick) were vapor deposited through a shadow mask using a thermal evaporator, thus forming transistors with a bottom gate, top contact architecture. Source and drain electrodes were oriented with the long dimension of the electrodes, the channel width, perpendicular to the dip axis. Source and Drain contacts are sized such that the width of the transistor is approximately 1000 micrometers, and the channel length is approximately 100 micrometers.

Mobility Value Test Method I

The saturation field effect mobility (μ) was determined using two Source Measure Units (Model 2400 from Keithley Instruments, Inc. (Cleveland, Ohio)). The devices were placed on an S-1160 Series probe station and probes connected using S-725-PRM manipulators (both available from Signatone Corp., Gilroy, Calif.). The drain to source bias voltage ($V_{DS}$) was held at −40 V, while the gate to source bias ($V_{GS}$) was incremented over the range +10 V to −40 V in 1 V steps. The drain-source current ($I_{DS}$) was measured as a function of gate-source voltage bias ($V_{GS}$) from +10V to −40V at a constant drain-source voltage bias ($V_{DS}$) of −40V. The saturation field effect mobility (μ) was calculated from the slope of the linear portion of the plot of the square root of $I_{DS}$ versus $V_{GS}$ using the equation $$I_{DS}=\mu WC(V_{GS}-V_t)^2 \div 2L$$

where C is the specific capacitance of the gate dielectric, W is the channel width, and L is the channel length. For some transistor samples prepared using Substrate E, the gate to source bias ($V_{GS}$) was incremented over the range +20 V to −40 V in 1.2 V steps.

Using a plot of the square root of $I_{DS}$ versus $V_{GS}$ curve, the X-axis extrapolation of a straight-line fit was taken as the threshold voltage ($V_t$). In addition, plotting $I_{DS}$ (using a log-scale) as a function of $V_{GS}$ afforded a curve where a straight line fit was drawn along a portion of the curve containing $V_t$. The inverse of the slope of this line was the sub-threshold slope (S). The on/off ratio was taken as the difference between the minimum and maximum drain current ($I_{DS}$) values of the $I_{DS}$-$V_{GS}$ curve.

Mobility Value Test Method II

The average mobility of each sample was determined in air under ambient lighting using two Source Measure Units (Model 2400 from Keithley Instruments, Inc. (Cleveland, Ohio)). The devices were placed on an S-1160 Series probe station and probes connected using S-725-PRM manipulators (both available from Signatone Corp., Gilroy, Calif.). The drain to source bias voltage ($V_{DS}$) was held at −40 V, while the gate to source bias ($V_{GS}$) was incremented over the range +10 V to −40 V in 1 V steps. The average mobility value is calculated from the measurement of 10 transistors on each substrate.

The "effective channel width" of the devices was determined because dip coating did not always result in complete coverage of the substrate. The percentage of substrate surface covered by dried semiconductor composition was measured by (i) taking three digital photos of the substrate at high magnification (100×), then (ii) using photo editing software (available under the trade designation PHOTOSHOP CS3 from Adobe Systems Inc., San Jose, Calif.) to identify and render areas of exposed substrate as uniform black (0,0,0) coloration in L,a,b color space, then (iii) using the histogram feature of the photo editing software to identify the percentage of photo with luminosity (L) <15, and then (iv) averaging the result of the three photos to give a value for surface coverage of the substrate. The value of surface coverage was then used to calculate the effective channel width of the TFTs, and this effective channel width was used to calculate charge carrier mobility values. The following formula was used to calculate effective channel width:

$$W_{\textit{eff}} = \left(\frac{W_{dep}}{100}\right) * C_{ov}$$

where $W_{\textit{eff}}$ is the effective channel width, $W_{dep}$ is the length of source and drain contacts (as-deposited), and $C_{ov}$ is the surface coverage (in percent). For example, if the source and drain electrodes were 1000 microns long and the surface coverage was 80 percent, then the effective channel width would be 800 microns.

The saturated field effect mobility (μ) was calculated from the slope (m) of the plot of the square root of drain current versus $V_{GS}$ using the following equation:

$$\mu = 2\left(\frac{m^2 L}{WC}\right)$$

where C is the specific capacitance of the gate dielectric, W is the effective channel width, and L is the channel length. The mobility value for each sample was the maximum mobility value observed over the range of measurement.

Mobility Value Test Method III

Same method as Mobility Test Method II, except the gate to source ($V_{GS}$) bias was incremented from +5 V to −40 V in 51 equally spaced steps.

In Tables 1-5 and 7-11, all the compositions listed in one table were inkjet printed onto the very same substrate sample. That is, one composition of the table was not inkjet printed onto one substrate sample and then another composition of the table inkjet printed onto another substrate sample of the same type and surface treatment. In Table 6, four substrates types are listed. For examples that list the same type of substrate, the compositions were inkjet printed onto the very same substrate sample.

Example 1 and Comparative Example 1

Figure 2:
FIG. 2 is an optical micrograph of a semiconductor deposit formed using a semiconductor composition containing only anisole as the solvent.
Figure 3:
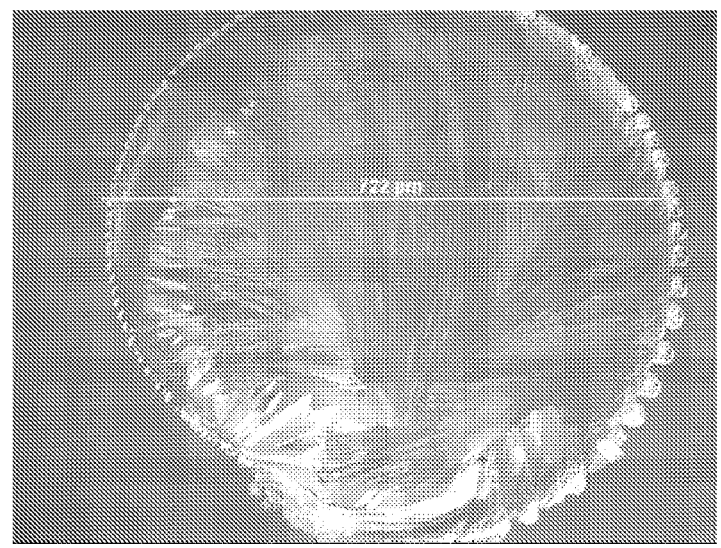
FIG. 3 is an optical micrograph of a semiconductor deposited formed using a semiconductor composition containing a mixture of anisole and decane as the solvent.

For Example 1 and Comparative Example 1, compositions of 1.8 weight percent TIPS in 91/9 anisole/decane and 2.0 weight percent TIPS in anisole, respectively, were prepared by Composition Preparation Method I. Each composition was deposited onto a cured ZrOAc dielectric layer of Substrate H by taking up a small volume of the appropriate composition in a typical laboratory disposable glass pipette, pressing the bulb to push out virtually all the composition from the pipette back into the vial holding the composition, then repeatedly pressing the bulb to expel small amounts of the composition that had remained on the walls of the pipette onto the cured ZrOAc dielectric layer. Both the composition and substrate were at room temperature. This process resulted in small droplets or a "mist" of composition that deposited onto the dielectric. The composition was allowed to dry for at least 20 minutes, and then the slide was observed under an Olympus MX50 optical microscope in differential interference contrast (DIC) mode. Optical micrographs of semiconductor deposits formed from the 2.0 weight percent TIPS in anisole and 1.8 weight percent TIPS in 91/9 anisole/decane compositions are shown in FIGS. 2 and 3, respectively.

The TIPS deposit from anisole did not uniformly cover the dielectric layer. Relatively large crystals were formed that only covered a small portion of the area originally covered by the composition. It appears that the composition was pinned on the substrate; that is, the location of the contact line between the composition and substrate was maintained at the same position as the anisole evaporated. Since anisole evaporates relatively slowly and the perimeter of the drop was pinned in the same location, relatively larger crystals formed. All the crystals were not flush against the dielectric layer. Rather, many grew up off the plane of the dielectric layer. At some point in the drying process, the composition became unpinned along at least a portion of the perimeter and the contact line moved inward to establish a new equilibrium position dictated by the interfacial tension between the composition and substrate. The composition again became pinned at this new location and more crystals were grown. Thus, crystals were deposited along the initial perimeter of the drop and in lines that represent the locations where the contact line became pinned. Also, it is possible that some of the lines of crystals do not signify the location of the pinned contact line. But rather they were formed when a pinned contact line became unstable and began to recede inward, and some of the crystals that had grown along this pinned line broke away and were carried by the receding solution, and then were redeposited on the substrate. The solution of TIPS in anisole appears to become pinned on the substrate resulting in insufficient coverage of the substrate with TIPS crystals.

The addition of decane to the composition to provide a 91/9 anisole/decane solvent mixture, dramatically changed the morphology of the TIPS deposit on the dielectric layer. The TIPS was deposited as well-defined crystallites over virtually the entire surface that was covered by the drop. It appears that the addition of decane reduced the tendency of the composition to pin to the substrate and it also reduced the contact angle of the composition with the substrate. The crystals tended to grow along the substrate rather than away from the substrate. The addition of decane may also have resulted in a recirculatory flow (i.e., Marangoni flow) in the composition as the solvent evaporated. This recirculatory flow may have contributed to the improved morphology.

Examples 2-4 and Comparative Examples 2-3

For each of Examples 2-4 and Comparative Examples 2-3, compositions were prepared by Composition Preparation Method I. Transistors were prepared by depositing the TIPS compositions onto Substrate E in Print Pattern 2 using Semiconductor Deposition Method I. The concentration of TIPS, the concentration of PS, the solvents, and relative amounts of the solvents are shown in Table 1. The average mobility was determined by Mobility Value Test Method I and the data are given in Table 1.

TABLE 1

Transistors of Examples 2-4 and Comparative Examples 2-3.

| Example | Weight percent TIPS | Weight percent PS | Solvent | Field effect mobility ($\mu$) |
|---|---|---|---|---|
| CE 2 | 1.8 | 0 | anisole | $1.60 \times 10^{-3}$ cm$^2$/V-s |
| 2 | 1.8 | 0 | 91/9 anisole/decane | $1.13 \times 10^{-2}$ cm$^2$/V-s |
| CE 3 | 1.8 | 0.9 | anisole | $1.36 \times 10^{-2}$ cm$^2$/V-s |
| 3 | 1.8 | 0.9 | 91/9 anisole/decane | $3.72 \times 10^{-2}$ cm$^2$/V-s |
| 4 | 1.8 | 0.9 | 88/12 anisole/decane | $5.29 \times 10^{-3}$ cm$^2$/V-s |

Examples 5-8 and Comparative Example 4

For each of Examples 5-8 and Comparative Example 4, compositions containing 1.8 weight percent TIPS and 0.9 weight percent PS were prepared by Composition Preparation Method I. The solvent or solvent mixtures included in the compositions are indicated in Table 2. Transistors were prepared by depositing the compositions onto Substrate E in Print Pattern 2 using Semiconductor Deposition Method I. The average mobility was determined by Mobility Value Test Method I and the data are given in Table 2.

TABLE 2

Transistors of Examples 5-8 and Comparative Example 4.

| Example | Solvent | Field effect mobility ($\mu$) |
|---|---|---|
| CE 4 | anisole | $1.06 \times 10^{-2}$ cm$^2$/V-s |
| 5 | 94/6 anisole/decane | $1.03 \times 10^{-2}$ cm$^2$/V-s |
| 6 | 91/9 anisole/decane | $2.27 \times 10^{-2}$ cm$^2$/V-s |
| 7 | 88/12 anisole/decane | $1.41 \times 10^{-2}$ cm$^2$/V-s |
| 8 | 85/15 anisole/decane | $8.42 \times 10^{-3}$ cm$^2$/V-s |

Example 9

In Example 9, a weighed mixture of 91 weight percent anisole and 9 weight percent decane was combined with sufficient TIPS and sufficient PS2 by Composition Preparation Method I to provide a composition containing 1.8 weight percent TIPS and 1.8 weight percent PS2. Transistors were prepared by depositing the composition onto Substrate E in Print Pattern 3 using Semiconductor Deposition Method I. The channel length was 30 micrometers. The average mobility was determined to be $4.67 \times 10^{-2}$ cm$^2$/V-s by Mobility Value Test Method I.

Examples 10-13

For each of Examples 10-13, compositions containing 1.8 weight percent TIPS and 0.9 weight percent PS were prepared by Composition Preparation Method I. Transistors were prepared by depositing the compositions onto Substrate E in Print Pattern 3 using Semiconductor Deposition Method I. The solvent mixtures used in the compositions are indicated in Table 3. The average mobility was determined by Mobility Value Test Method I and the data are given in Table 3.

TABLE 3

Transistors of Examples 10-13.

| Example | Solvent | Field effect mobility ($\mu$) |
|---|---|---|
| 10 | 97/3 anisole/dodecane | $4.17 \times 10^{-4}$ cm$^2$/V-s |
| 11 | 94/6 anisole/dodecane | $4.76 \times 10^{-5}$ cm$^2$/V-s |
| 12 | 91/9 anisole/dodecane | $3.48 \times 10^{-7}$ cm$^2$/V-s |
| 13 | 91/9 anisole/decane | $1.00 \times 10^{-2}$ cm$^2$/V-s |

Examples 14-16

For each of Examples 14-16, compositions containing 1.8 weight percent TIPS and 0.9 weight percent PS were prepared by Composition Preparation Method I. Transistors were prepared by depositing the compositions onto Substrate E in Print Pattern 3 using Semiconductor Deposition Method I. The solvent mixtures included in the compositions are indicated in Table 4. The average mobility was determined by Mobility Value Test Method I and the data are given in Table 4.

TABLE 4

Transistors of Examples 14-16.

| Example | Solvent | Field effect mobility ($\mu$) |
|---|---|---|
| 14 | 97/3 anisole/undecane | $5.58 \times 10^{-3}$ cm$^2$/V-s |
| 15 | 94/6 anisole/undecane | $8.26 \times 10^{-4}$ cm$^2$/V-s |
| 16 | 91/9 anisole/decane | $3.33 \times 10^{-2}$ cm$^2$/V-s |

Examples 17-18 and Comparative Examples 5-8

For each of Example 17-18, the compositions were prepared by Composition Preparation Method I. For Comparative Example 5-8, a solvent mixture was prepared by adding 1 part by volume of dodecane and 3 parts by volume of chlorobenzene to a vial and stirring the contents to form a 75 volume percent chlorobenzene and 25 volume percent dodecane solvent mixture. This solvent mixture was then used to make compositions by Composition Preparation Method I. The solvent mixtures used are indicated in Table 5. Transistors were prepared by depositing the compositions onto Substrate E in Print Pattern 3 using Semiconductor Deposition Method I. For Example 17 and Comparative Examples 5-6, the transistor channel length was 100 micrometers. For Example 18 and Comparative Examples 7-8, the transistor channel length was 30 micrometers. The average mobility was determined by Mobility Value Test Method I and the data are given in Table 5.

TABLE 5

Transistors of Examples 17-18 and Comparative Examples 5-8.

| Example | Weight percent TIPS | Weight percent PS | Solvent | Field effect mobility ($\mu$) |
|---|---|---|---|---|
| 17 | 1.8 | 0.9 | 91/9 anisole/decane | $1.50 \times 10^{-2}$ cm$^2$/V-s |
| CE 5 | 1.8 | 0 | 75/25 chlorobenzene/dodecane | $8.25 \times 10^{-6}$ cm$^2$/V-s |
| CE 6 | 1.8 | 0.9 | 75/25 chlorobenzene/dodecane | No transistor behavior |
| 18 | 1.8 | 0.9 | 91/9 anisole/decane | $4.08 \times 10^{-2}$ cm$^2$/V-s |
| CE 7 | 1.8 | 0 | 75/25 chlorobenzene/dodecane | $6.33 \times 10^{-4}$ cm$^2$/V-s |
| CE 8 | 1.8 | 0.9 | 75/25 chlorobenzene/dodecane | $1.74 \times 10^{-3}$ cm$^2$/V-s |

Examples 19-22 and Comparative Examples 9-10

For each of Examples 19-22 and Comparative Examples 9-10, compositions were prepared by Composition Preparation Method I. The compositions used in Examples 19-22 contained 1.8 weight percent TIPS and 0.9 weight percent PS in 91/9 anisole/decane. The composition used for CE 9 and CE 10 contained 2.0 weight percent TIPS and 1.0 weight percent PS in anisole. Transistors were prepared by depositing the compositions onto the substrates in Print Pattern 1 using Semiconductor Deposition Method I. The average mobility was determined by Mobility Value Test Method I and the data are given in Table 6.

TABLE 6

Transistors of Examples 19-22 and Comparative Examples 9-10.

| Example | Solvent | Substrate | Field effect mobility ($\mu$) |
|---|---|---|---|
| 19 | 91/9 anisole/decane | A | $5.22 \times 10^{-2}$ cm$^2$/V-s |
| 20 | 91/9 anisole/decane | B | $1.64 \times 10^{-2}$ cm$^2$/V-s |
| 21 | 91/9 anisole/decane | C | $2.66 \times 10^{-2}$ cm$^2$/V-s |
| 22 | 91/9 anisole/decane | D | $2.25 \times 10^{-2}$ cm$^2$/V-s |
| CE 9 | anisole | C | $4.52 \times 10^{-3}$ cm$^2$/V-s |
| CE 10 | anisole | D | $6.42 \times 10^{-3}$ cm$^2$/V-s |

Examples 23-27 and Comparative Example 11

For each of Examples 23-27 and Comparative Example 11, compositions containing 1.8 weight percent TIPS and 0.9 weight percent PS were prepared by Composition Preparation Method I. The solvent or solvent mixtures included in the compositions are indicated in Table 7. Transistors were prepared comprising depositing the compositions onto Substrate E in Print Pattern 3 using Semiconductor Deposition Method I. The average mobility was determined by Mobility Value Test Method I and the data are given in Table 7.

TABLE 7

Transistors of Examples 23-27 and Comparative Example 11.

| Example | Solvent | Field effect mobility ($\mu$) |
|---|---|---|
| CE 11 | DMA | $2.47 \times 10^{-2}$ cm$^2$/V-s |
| 23 | 97/3 DMA/dodecane | $2.81 \times 10^{-2}$ cm$^2$/V-s |
| 24 | 94/6 DMA/dodecane | $2.12 \times 10^{-2}$ cm$^2$/V-s |
| 25 | 91/6/3 DMA/dodecane/decane | $9.21 \times 10^{-3}$ cm$^2$/V-s |
| 26 | 88/6/6 DMA/dodecane/decane | $2.09 \times 10^{-2}$ cm$^2$/V-s |
| 27 | 91/9 anisole/decane | $3.07 \times 10^{-2}$ cm$^2$/V-s |

Examples 28-33

For each of Examples 28-33, compositions containing 1.8 weight percent TIPS and 0.9 weight percent PS were prepared by Composition Preparation Method I. The solvent mixtures included in the compositions are indicated in Table 8. Transistors were prepared by depositing the compositions onto Substrate E in Print Pattern 3 using Semiconductor Deposition Method I. The average mobility was determined by Mobility Value Test Method I and the data are given in Table 8.

TABLE 8

Transistors of Examples 28-33.

| Example | Solvent | Field effect mobility ($\mu$) |
|---|---|---|
| 28 | 94/6 DMA/undecane | $1.21 \times 10^{-4}$ cm$^2$/V-s |
| 29 | 91/9 DMA/undecane | $5.95 \times 10^{-3}$ cm$^2$/V-s |
| 30 | 88/12 DMA/undecane | $5.51 \times 10^{-4}$ cm$^2$/V-s |
| 31 | 97/3 DMA/dodecane | $2.14 \times 10^{-2}$ cm$^2$/V-s |
| 32 | 94/6 DMA/dodecane | $2.22 \times 10^{-2}$ cm$^2$/V-s |
| 33 | 91/9 anisole/decane | $1.65 \times 10^{-2}$ cm$^2$/V-s |

Examples 34-37 and Comparative Example 12

For each of Examples 34-37 and Comparative Examples 12, compositions were prepared by Composition Preparation Method I. The amount of TIPS, amount of PS, and the solvent or solvent mixtures included in the compositions are shown in Table 9. Transistors were prepared by depositing the compositions onto Substrate F in Print Pattern 2 using Semiconductor Deposition Method I. The average mobility was determined by Mobility Value Test Method I and the data are given in Table 9.

TABLE 9

Transistors of Examples 34-37 and Comparative Examples 12.

| Example | Weight percent TIPS | Weight percent PS | Solvent | Field effect mobility ($\mu$) |
|---|---|---|---|---|
| CE 12 | 1.8 | 0.9 | anisole | $4.45 \times 10^{-2}$ cm$^2$/V-s |
| 34 | 1.8 | 0.9 | 97/3 anisole/decane | $4.15 \times 10^{-3}$ cm$^2$/V-s |

TABLE 9-continued

Transistors of Examples 34-37 and Comparative Examples 12.

| Example | Weight percent TIPS | Weight percent PS | Solvent | Field effect mobility (μ) |
|---|---|---|---|---|
| 35 | 1.8 | 0.9 | 94/6 anisole/decane | $1.45 \times 10^{-3}$ cm$^2$/V-s |
| 36 | 1.8 | 0.9 | 91/9 anisole/decane | $5.07 \times 10^{-2}$ cm$^2$/V-s |
| 37 | 1.8 | 0.9 | 85/15 anisole/decane | $1.12 \times 10^{-2}$ cm$^2$/V-s |

Examples 38-39 and Comparative Examples 13-14

For each of Examples 38-39 and Comparative Examples 13-14, compositions were prepared by Composition Preparation Method I. The amount of TIPS, amount of PS, and the solvent or solvent mixtures included in the compositions are shown in Table 10. Transistors were prepared by depositing the compositions onto Substrate F in Print Pattern 2 using Semiconductor Deposition Method I. The average mobility was determined by Mobility Value Test Method I and the data are given in Table 10.

TABLE 10

Transistors of Examples 38-39 and Comparative Examples 13-14.

| Example | Weight percent TIPS | Weight percent PS | Solvent | Field effect mobility (μ) |
|---|---|---|---|---|
| CE 13 | 1.8 | 0 | anisole | $1.19 \times 10^{-3}$ cm$^2$/V-s |
| 38 | 1.8 | 0 | 91/9 anisole/decane | $5.07 \times 10^{-3}$ cm$^2$/V-s |
| CE 14 | 1.8 | 0.9 | anisole | $4.78 \times 10^{-2}$ cm$^2$/V-s |
| 39 | 1.8 | 0.9 | 91/9 anisole/decane | $3.85 \times 10^{-2}$ cm$^2$/V-s |

Example 40 and Comparative Example 15

For Example 40 and Comparative Example 15, compositions containing 1.8 weight percent TIPS and 0.9 weight percent PS were prepared by Composition Preparation Method II. The solvent or solvent mixture included in the compositions is indicated in Table 11. Transistors were prepared by depositing the compositions onto Substrate I, all-inkjet printed layered transistor structures on PEN film, using Semiconductor Deposition Method II. The channel length was 150 micrometers. The average mobility was determined by Mobility Value Test Method I and the data are given in Table 11.

TABLE 11

Transistors of Example 40 and Comparative Example 15.

| Example | Solvent | Field effect mobility (μ) |
|---|---|---|
| CE 15 | anisole | $5.40 \times 10^{-2}$ cm$^2$/V-s |
| 40 | 91/9 anisole/decane | $2.21 \times 10^{-1}$ cm$^2$/V-s |

Examples 41-45 and Comparative Example 16-18

For each of Examples 41-45 and Comparative Examples 16-18, compositions of 1.8 to 2.0 weight percent semiconductor were prepared by Composition Preparation Method II. The solvent or solvent mixtures included in the compositions are indicated in Table 12. Transistors were prepared by depositing the semiconductor compositions onto Substrate G using the dip-coating as described in Semiconductor Deposition Method III. The average mobility of each sample was determined by Mobility Value Test Method II and the data are given in Table 12.

TABLE 12

Transistors of Examples 41-45 and Comparative Examples 16-18.

| Example | Semiconductor | Solvent | Field effect mobility (μ) |
|---|---|---|---|
| CE 16 | TIPS | anisole | Solution did not coat |
| 41 | TIPS | 91/9 anisole/decane | 0.261 cm$^2$/V-s |
| CE 17 | IP-DIPS | anisole | 0.118 cm$^2$/V-s |
| 42 | IP-DIPS | 91/9 anisole/decane | 0.155 cm$^2$/V-s |
| CE 18 | A-DIPS | anisole | 0.145 cm$^2$/V-s |
| 43 | A-DIPS | 91/9 anisole/decane | 0.191 cm$^2$/V-s |
| 44 | C-DIPS | 91/9 anisole/decane | 0.600 cm$^2$/V-s |
| 45 | B-DIPS | 91/9 anisole/decane | 0.191 cm$^2$/V-s |

Examples 46-50 and Comparative Example 19

For each of Examples 46-50 and Comparative Example CE 19, compositions containing 1.8 weight percent TIPS and 0.9 weight percent PS were prepared by Composition Preparation Method I. The solvent or solvent mixtures included in the compositions are indicated in Table 13. Transistors were prepared comprising depositing the compositions onto Substrate E in Print Pattern 3 using Semiconductor Deposition Method I. The average mobility was determined by Mobility Value Test Method I and the data are given in Table 13.

TABLE 13

Transistors of Examples 46-50 and Comparative Example 19.

| Example | Solvent | Field effect mobility (μ) |
|---|---|---|
| CE 19 | nbb | $5.70 \times 10^{-3}$ |
| 46 | 91/9 nbb/decane | $5.16 \times 10^{-4}$ |
| 47 | 91/9 nbb/undecane | $1.22 \times 10^{-2}$ |
| 48 | 94/6 nbb/undecane | $1.15 \times 10^{-2}$ |
| 49 | 97/3 nbb/undecane | $1.06 \times 10^{-2}$ |
| 50 | 91/9 nbb/dodecane | $3.99 \times 10^{-4}$ |

Examples 51-53 and Comparative Example 20

For each of Examples 51-53 and Comparative Example 20, samples were prepared by dip-coating according to Semiconductor Deposition Method III. The semiconductor solution for each example and comparative example was a 1.8-2.0 weight percent solution of TIPS in the solvent system indicated in Table 14. These solutions were prepared by Composition Preparation Method II. Mobility values were calculated according to Mobility Value Test Method III.

TABLE 14

Transistors of Examples 51-53 and Comparative Example 20.

| Example | Solvent | Field effect mobility (μ) |
|---|---|---|
| CE 20 | 100/0 nbb/decane | 0.208 cm²/V-s |
| 51 | 94/6 nbb/decane | 0.306 cm²/V-s |
| 52 | 91/9 nbb/decane | 0.233 cm²/V-s |
| 53 | 88/12 nbb/decane | 0.257 cm²/V-s |

Examples 54-56 and Comparative Example 21

For each of Examples 54-56 and Comparative Example 21, samples were prepared by dip-coating according to Semiconductor Deposition Method III. The semiconductor solution for each example and comparative example was a 1.8-2.0 weight percent solution of TIPS in the solvent system shown in Table 15. These solutions were prepared by Composition Preparation Method II. Mobility values were calculated according to Mobility Value Test Method III.

TABLE 15

Transistors of Examples 54-56 and Comparative Example 21.

| Example | Solvent | Field effect mobility (μ) |
|---|---|---|
| CE 21 | 100/0 nbb/dodecane | 0.208 cm²/V-s |
| 54 | 94/6 nbb/dodecane | 0.306 cm²/V-s |
| 55 | 91/9 nbb/dodecane | 0.237 cm²/V-s |
| 56 | 88/12 nbb/dodecane | 0.141 cm²/V-s |

Examples 57-59 and Comparative Example 22

For each of Examples 57-59 and Comparative Example 22, samples were prepared by dip-coating according to Semiconductor Deposition Method III. The semiconductor solution for each example and comparative example was a 1.8-2.0 weight percent solution of A-DIPS in the solvent mixture shown in Table 16. These solutions were prepared by Composition Preparation Method II. The alkane used in each Example and Comparative Example was decane. Mobility values were calculated according to Mobility Value Test Method III.

TABLE 16

Transistors of Examples 57-59 and Comparative Example 22.

| Example | Solvent | Field effect mobility (μ) |
|---|---|---|
| CE 22 | 100/0 nbb/decane | 0.228 cm²/V-s |
| 57 | 94/6 nbb/decane | 0.225 cm²/V-s |
| 58 | 91/9 nbb/decane | 0.455 cm²/V-s |
| 59 | 88/12 nbb/decane | 0.140 cm²/V-s |

Various modifications and alterations to this invention will become apparent to those skilled in the art without departing from the scope and spirit of this invention. It should be understood that his invention is not intended to be unduly limited by the illustrative embodiments and examples set forth herein and that such examples and embodiments are presented by way of example only with the scope of the invention intended to be limited only by the claims set forth herein as follows.

What is claimed is:

1. A composition comprising:
   a) a solvent mixture comprising
      i) an alkane having 6 to 16 carbon atoms present in an amount in a range of 1 to 20 weight percent based on a weight of the solvent mixture; and
      ii) an aromatic compound of Formula (I)

present in an amount in a range of 80 to 99 weight percent based on the weight of the solvent mixture, wherein
   $R^a$ is an alkyl, heteroalkyl, alkoxy, heteroalkoxy, or a fused 5 to 6 member ring;
   each $R^b$ is independently selected from an alkyl, alkoxy, or a halo;
   n is an integer in the range of 0 to 5; and
   b) an organic semiconductor material dissolved in the solvent mixture in an amount equal to at least 0.1 weight percent based on a total weight of the composition, the organic semiconductor being of Formula (II)

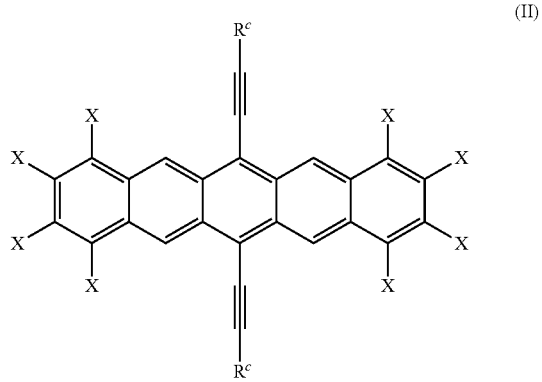

wherein,
   each $R^c$ is independently selected from an unsubstituted or substituted alkyl, an unsubstituted or substituted heteroalkyl, an unsubstituted or substituted alkenyl, an unsubstituted or substituted aryl, an unsubstituted or substituted heteroaryl, a ferrocenyl, or a silyl group of formula —$Si(R^d)_3$;

each $R^d$ is independently selected from hydrogen, an unsubstituted or substituted alkyl, an unsubstituted or substituted heteroalkyl, an unsubstituted or substituted alkenyl, an unsubstituted or substituted alkynyl, a substituted or unsubstituted aryl, an unsubstituted or substituted heteroaryl, or acetyl;

each X is independently selected from hydrogen, halo, alkyl, alkoxy, aryl, heteroaryl, alkenyl, cyano, or heteroalkyl;

wherein a substituted alkyl or substituted heteroalkyl is substituted with at least one aryl, heteroaryl, halo, cyano, hydroxyl, or carboxyl group; and wherein a substituted alkenyl or substituted alkynyl is substituted with at least one alkoxy, aryl, heteroaryl, halo, cyano, hydroxyl, or carboxyl group; and wherein a substituted aryl or substituted heteroaryl is substituted with at least one alkyl, alkoxy, heteroalkyl, alkoxy, halo, cyano, hydroxyl, —SeH, or carboxyl group.

2. The composition of claim 1, wherein $R^c$ is the silyl group of formula —Si$(R^d)_3$.

3. The composition of claim 1, wherein the organic semiconductor is selected from a compound of Formula (IV) to (X)

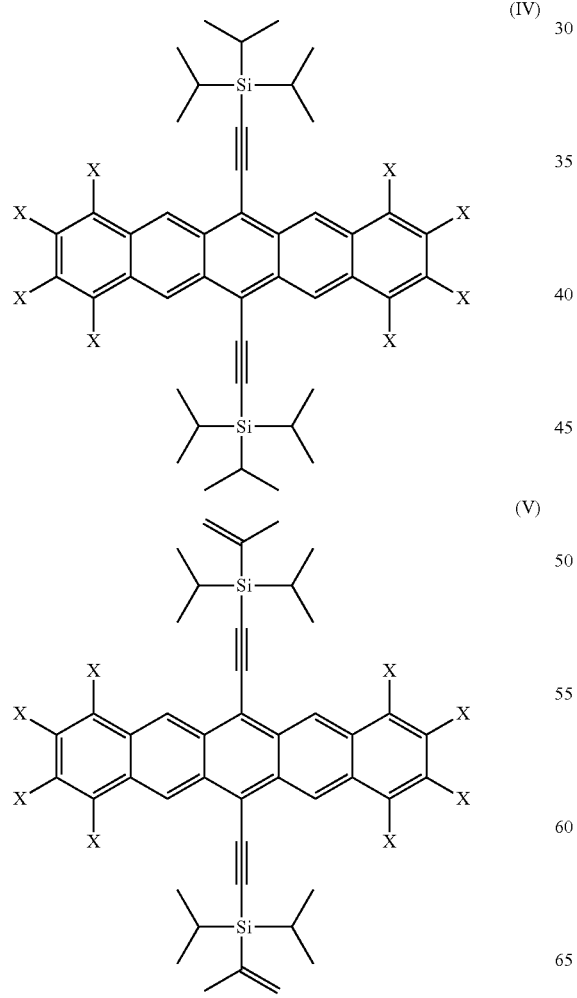

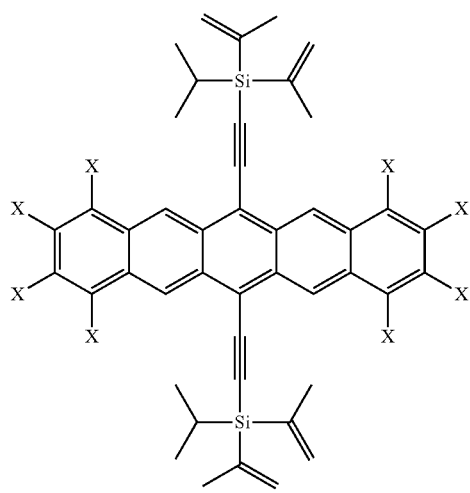

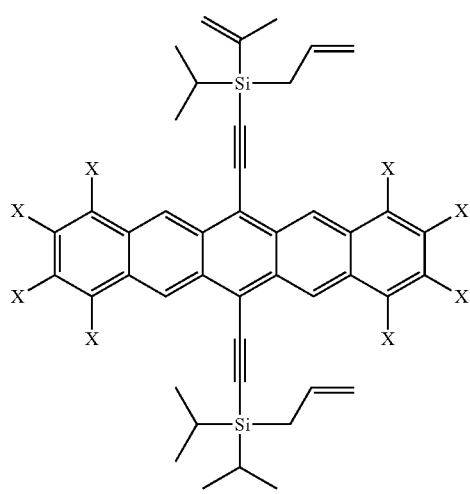

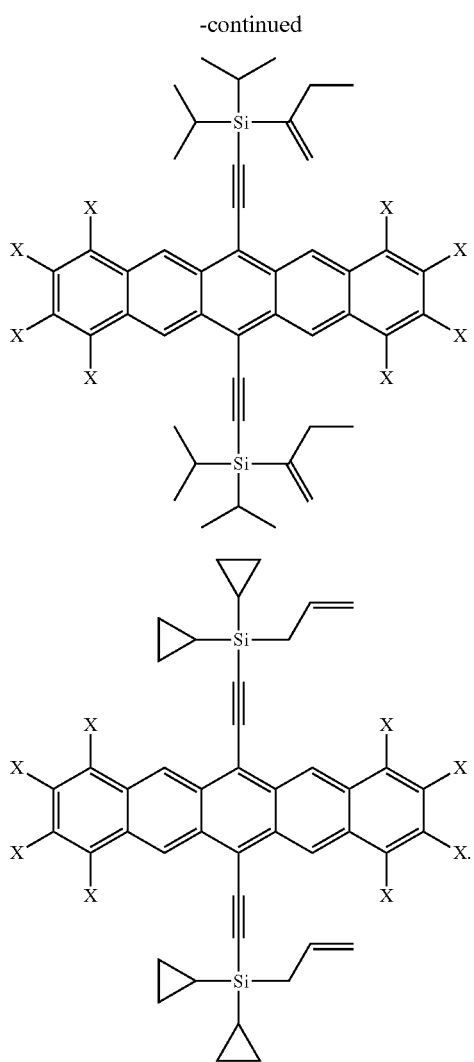

4. The composition of claim 1, wherein the aromatic compound of Formula (I) comprises anisole, 3,5-dimethylanisole, n-butylbenzene, or a mixture thereof and the alkane comprises decane, undecane, dodecane, or a mixture thereof.

5. The composition of claim 1, wherein the solvent mixture comprises 88 to 99 weight percent aromatic compound of Formula (I) and 1 to 12 weight percent alkane.

6. The composition of claim 1, wherein $R^a$ is an alkoxy group having 1 to 10 carbon atoms or an alkyl having 1 to 10 carbon atoms.

7. The composition of claim 1, wherein the aromatic compound of Formula (I) comprises anisole, 2-methylanisole, 3-methylanisole, 4-methylanisole, 2,3-dimethylanisole, 2,4-dimethylanisole, 2,5-dimethylanisole, 2,6-dimethylanisole, 3,4-dimethylanisole, 3,5-dimethylanisole, 2-chloroanisole, 3-chloroanisole, 4-chloroanisole, 1,2-dimethoxybenzene, or a mixture thereof.

8. The composition of claim 1, wherein the aromatic compound of Formula (I) comprises n-butylbenzene, sec-butylbenzene, tert-butylbenzene, isobutylbenzene, isopropyltoluene, n-propylbenzene, isopropylbenzene (cumene), mesitylene, tetrahydronaphthalene, or a mixture thereof.

9. The composition of claim 1, wherein the aromatic compound of Formula (I) comprises n-butylbenzene, anisole, 3,5-dimethylanisole, or a mixture thereof.

10. The composition of claim 1, wherein the alkane has 9 to 13 carbon atoms.

11. The composition of claim 1, wherein the alkane comprises decane, undecane, dodecane or a mixture thereof.

12. The composition of claim 1, wherein the solvent mixture comprises anisole and decane, 3,5-dimethylanisole and dodecane, or n-butylbenzene and undecane.

13. The composition of claim 1, wherein the alkane has a boiling point that is 5° C. to 35° C. greater than a boiling point of the aromatic compound of Formula (I).

14. The composition of claim 13, wherein the alkane is present in an amount in a range of 1 to 12 weight percent based on the weight of the solvent mixture and the aromatic compound of Formula (I) is present in an amount in a range of 88 to 99 weight percent based on the total weight of the solvent mixture.

15. The composition of claim 14, wherein the alkane has 9 to 16 carbon atoms.

16. A method of making a semiconductor device, the method comprising
providing a composition comprising
a) a solvent mixture comprising
i) an alkane having 6 to 16 carbon atoms present in an amount in a range of 1 to 20 weight percent based on a weight of the solvent mixture; and
ii) an aromatic compound of Formula (I)

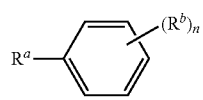

present in an amount in a range of 80 to 99 weight percent based on the weight of the solvent mixture, wherein
$R^a$ is an alkyl, heteroalkyl, alkoxy, heteroalkoxy, or a fused 5 to 6 member ring;
each $R^b$ is independently selected from an alkyl, alkoxy, or a halo;
n is an integer in the range of 0 to 5; and
b) an organic semiconductor material dissolved in the solvent mixture in an amount equal to at least 0.1 weight percent based on a total weight of the composition, wherein the organic semiconductor is of Formula (II)

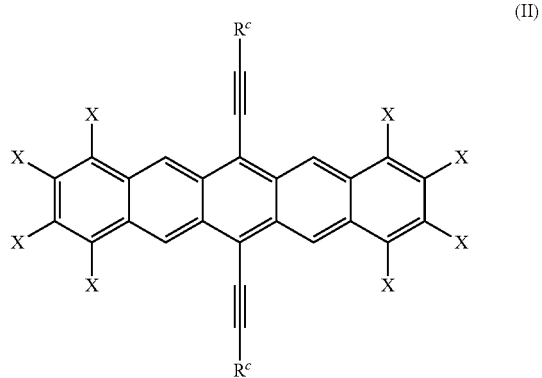

wherein,
- each $R^c$ is independently selected from an unsubstituted or substituted alkyl, an unsubstituted or substituted heteroalkyl, an unsubstituted or substituted alkenyl, an unsubstituted or substituted aryl, an unsubstituted or substituted heteroaryl, a ferrocenyl, or a silyl group of formula —Si($R^d$)$_3$;
- each $R^d$ is independently selected from hydrogen, an unsubstituted or substituted alkyl, an unsubstituted or substituted heteroalkyl, an unsubstituted or substituted alkenyl, an unsubstituted or substituted alkynyl, a substituted or unsubstituted aryl, an unsubstituted or substituted heteroaryl, or acetyl;
- each X is independently selected from hydrogen, halo, alkyl, alkoxy, aryl, heteroaryl, alkenyl, cyano, or heteroalkyl;
- wherein a substituted alkyl or substituted heteroalkyl is substituted with at least one aryl, heteroaryl, halo, cyano, hydroxyl, or carboxyl group; and
- wherein a substituted alkenyl or substituted alkynyl is substituted with at least one alkoxy, aryl, heteroaryl, halo, cyano, hydroxyl, or carboxyl group; and
- wherein a substituted aryl or substituted heteroaryl is substituted with at least one alkyl, heteroalkyl, alkoxy, halo, cyano, hydroxyl, —SeH, or carboxyl group; and depositing the composition adjacent to a conductive material or adjacent to a dielectric material to form a deposited layer; and removing at least 80 weight percent of the solvent mixture from the deposited layer to form a semiconductor layer.

17. The method of claim 16, wherein $R^c$ is a silyl group of formula —Si($R^d$)$_3$.

18. The method of claim 16, wherein the aromatic compound of Formula (I) comprises anisole, 3,5-dimethylanisole, n-butylbenzene, or a mixture thereof and the alkane comprises decane, undecane, dodecane, or a mixture thereof.

19. The method of claim 16, wherein the solvent mixture comprises anisole and decane, 3,5,-dimethylanisole and dodecane, or n-butylbenzene and undecane.

20. The method of claim 16, wherein the alkane has a boiling point that is 5° C. to 35° C. greater than a boiling point of the aromatic compound of Formula (I).

21. The method of claim 20, wherein the alkane is present in an amount in a range of 1 to 12 weight percent based on the weight of the solvent mixture and the aromatic compound of Formula (I) is present in an amount in a range of 88 to 99 weight percent based on the total weight of the solvent mixture.

22. The method of claim 21, wherein the alkane has 9 to 16 carbon atoms.

* * * * *

UNITED STATES PATENT AND TRADEMARK OFFICE
CERTIFICATE OF CORRECTION

PATENT NO. : 8,232,550 B2
APPLICATION NO. : 12/996473
DATED : July 31, 2012
INVENTOR(S) : Robert S Clough It is certified that error appears in the above-identified patent and that said Letters Patent is hereby corrected as shown below:

Column 3
Line 3, delete "—ScH," and insert -- —SeH, --, therefor.

Column 4
Line 61, delete "tent-butyl," and insert -- tert-butyl, --, therefor.

Line 62, delete "cylcopentyl," and insert -- cyclopentyl, --, therefor.

Line 62-63, delete "cylcohexyl," and insert -- cyclohexyl, --, therefor.

Column 5
Line 10-11, delete "heterotatoms," and insert -- heteroatoms, --, therefor.

Line 37-38, delete "cylcohexoxy" and insert -- cyclohexoxy --, therefor.

Line 60, delete "carbocylic" and insert -- carbocyclic --, therefor.

Column 6
Line 5, delete "tent-butyl," and insert -- tert-butyl, --, therefor.

Line 8, after "butoxy" insert -- . --.

Line 25, delete "tent-butylbenzene," and insert -- tert-butylbenzene, --, therefor.

Column 8
Line 27, delete "perlyene" and insert -- perylene --, therefor.

Line 33, delete "phthalocyanine" and insert -- phthalocyanine. --, therefor.

Signed and Sealed this
Eighteenth Day of December, 2012

David J. Kappos
*Director of the United States Patent and Trademark Office*

CERTIFICATE OF CORRECTION (continued)

Column 10
Line 28, delete "—ScH," and insert -- —SeH, --, therefor.

Line 58, delete ""cylcoalkylalkylene"" and insert -- "cycloalkylalkylene" --, therefor.

Column 11
Line 51, delete "(R")$_z$." and insert -- (R''')$_z$. --, therefor.

Line 57, delete "R'" and insert -- R''' --, therefor.

Column 13
Line 3-23 (Approx.) (Structure VII), delete

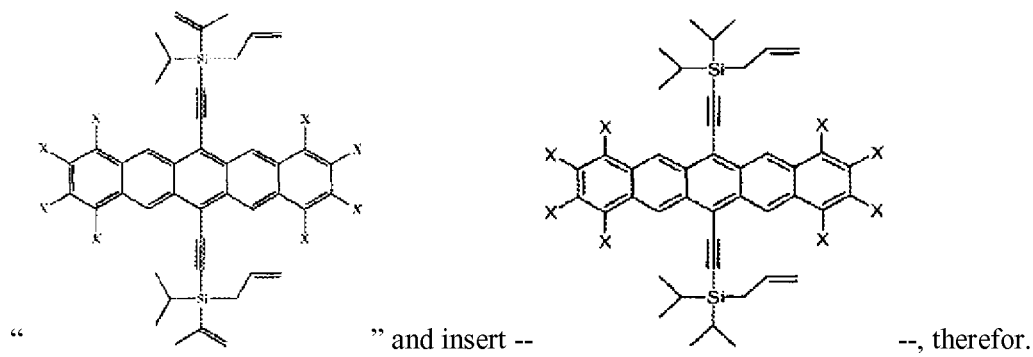

--, therefor.

Column 14
Line 24, delete "—Si(R)" and insert -- —Si(R') --, therefor.

Line 38, delete "outrmost" and insert -- outermost --, therefor.

Column 17
Line 46, delete "shaking" and insert -- shaking. --, therefor.

Column 21
Line 46, delete "GO," and insert -- ($\mu$), --, therefor.

Column 23
Line 8-9, delete "3-methacryloxypropyl)trimethoxysilane," and insert
-- 3-(methacryloxypropyl)trimethoxysilane, --, therefor.

Line 54, delete "NH$_4$Clsolution," and insert -- NH$_4$Cl solution, --, therefor.

Column 26
Line 2, delete "28 H)," and insert -- 28H), --, therefor.

CERTIFICATE OF CORRECTION (continued)
U.S. Pat. No. 8,232,550 B2

Column 29
Line 9-10, delete "(Alburquerque," and insert -- (Albuquerque, --, therefor.

Line 56, delete "compostiion." and insert -- composition. --, therefor.

Column 30
Line 29, delete "(Alburquerque," and insert -- (Albuquerque, --, therefor.

Column 31
Line 33-45, delete "Upon completion...............of Substrate I." and insert the same on Col. 31, Line 34, after "method." as a new paragraph.

Column 44
Line 25-45 (Approx.) (Structure VII), in Claim 3, delete " 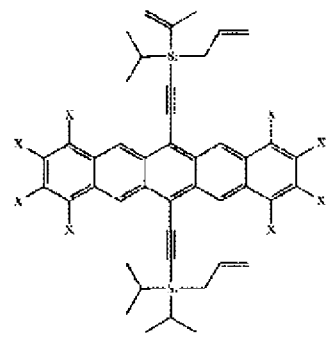 " and insert -- 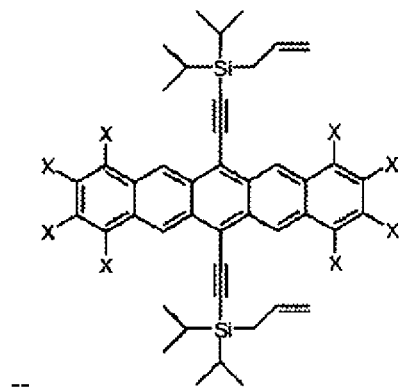 --, therefor.

Column 46
Line 7, in Claim 12, delete "n-butlybenzene" and insert -- n-butylbenzene --, therefor.